US009594133B2

(12) United States Patent
Kurokawa et al.

(10) Patent No.: US 9,594,133 B2
(45) Date of Patent: Mar. 14, 2017

(54) MAGNETIC RESONANCE IMAGING APPARATUS AND MULTI-ECHO MULTI-CONTRAST IMAGING METHOD

(75) Inventors: Shinji Kurokawa, Tokyo (JP); Norihiko Ozawa, Tokyo (JP); Takayuki Abe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1055 days.

(21) Appl. No.: 13/818,748

(22) PCT Filed: Aug. 18, 2011

(86) PCT No.: PCT/JP2011/068648
§ 371 (c)(1),
(2), (4) Date: Feb. 25, 2013

(87) PCT Pub. No.: WO2012/026380
PCT Pub. Date: Mar. 1, 2012

(65) Prior Publication Data
US 2013/0147483 A1    Jun. 13, 2013

(30) Foreign Application Priority Data

Aug. 25, 2010 (JP) ................. 2010-188120

(51) Int. Cl.
*G01R 33/44* (2006.01)
*G01R 33/34* (2006.01)
(Continued)

(52) U.S. Cl.
CPC ........... *G01R 33/446* (2013.01); *G01R 33/34* (2013.01); *G01R 33/4818* (2013.01);
(Continued)

(58) Field of Classification Search
CPC ........... G01R 33/4818; G01R 33/4824; G01R 33/561; G01R 33/34; G01R 33/446; G01R 33/482; G01R 33/5617
(Continued)

(56) References Cited

U.S. PATENT DOCUMENTS 5,168,226 A    12/1992    Hinks
5,229,717 A    7/1993    Hinks
(Continued)

FOREIGN PATENT DOCUMENTS

JP    5-192313    8/1993
JP    6-54828    3/1994
(Continued)

OTHER PUBLICATIONS

English translation of JP2004057682. Translation provided Espacenet on Sep. 6, 2016.*
(Continued)

*Primary Examiner* — Melissa Koval
*Assistant Examiner* — Rishi Patel
(74) *Attorney, Agent, or Firm* — Cooper & Dunham LLP

(57) ABSTRACT

In multi-echo multi-contrast imaging, the image quality is improved by suppressing an increase in imaging time. In order to do so, the arrangement order of echo signals that form an echo train and k space filled with each echo signal are determined such that the continuity of the echo arrangement is maintained while sharing an echo signal between contrasts in multi-echo multi-contrast imaging. Echo trains that perform echo sharing are arranged in non-oscillatory centric view ordering (NOCO). In addition, the starting point of echo sharing of one echo train is connected to the same position of another echo train. When some discontinu-
(Continued)

ous regions are present, the discontinuous regions may be corrected using continuous data of regions symmetrical thereto on the k space.

8 Claims, 18 Drawing Sheets

(51) Int. Cl.
*G01R 33/48* (2006.01)
*G01R 33/561* (2006.01)

(52) U.S. Cl.
CPC ........ *G01R 33/482* (2013.01); *G01R 33/4824* (2013.01); *G01R 33/5617* (2013.01)

(58) Field of Classification Search
USPC ................... 324/307, 309; 600/410; 382/131
See application file for complete search history.

(56) References Cited

U.S. PATENT DOCUMENTS

| | | | |
|---|---|---|---|
| 5,557,204 A | 9/1996 | Lenz | |
| 5,825,185 A * | 10/1998 | Liu | .................. G01R 33/56554 324/307 |
| 2005/0033151 A1 * | 2/2005 | Wu | ....................... G01R 33/561 600/410 |
| 2009/0082656 A1 | 3/2009 | Bayram et al. | |
| 2010/0277172 A1 | 11/2010 | Takizawa | |
| 2010/0296717 A1 | 11/2010 | Takizawa | |

FOREIGN PATENT DOCUMENTS

| | | |
|---|---|---|
| JP | 7-136144 | 5/1995 |
| JP | 8-56931 | 3/1996 |
| JP | 9-66043 | 3/1997 |
| JP | 2004-57682 | 2/2004 |
| WO | WO 2009/081787 | 7/2009 |
| WO | WO 2009/093517 | 7/2009 |

OTHER PUBLICATIONS

Feb. 2, 2015 Japanese official action in corresponding Japanese Patent Application No. 2012-530637.
International Search. Report in PCT/JP2011/068648.
Reed F. Busse et al. "Effects of Refocusing Flip Angle Modulation and View Ordering in 3D Fast Spin Echo", Magnetic Resonance in Medicine 60, (2008) pp. 640-649.

* cited by examiner

MAGNETIC RESONANCE IMAGING APPARATUS AND MULTI-ECHO MULTI-CONTRAST IMAGING METHOD

TECHNICAL FIELD

The present invention relates to a nuclear magnetic resonance imaging (hereinafter, referred to as "MRI") technique for measuring a nuclear magnetic resonance (hereinafter, referred to as "NMR") signal from hydrogen, phosphor, or the like in an object and imaging nuclear density distribution, relaxation time distribution, or the like, and in particular to a multi-echo multi-contrast imaging technique.

BACKGROUND ART

The MRI apparatus is an apparatus that measures an NMR signal generated by the object, especially, the nuclear spins of atoms which form human tissue, and images the shapes or functions of the head, abdomen, limbs, and the like in a two-dimensional manner or in a three-dimensional manner. In the imaging, different phase encoding and different frequency encoding are given to NMR signals according to the gradient magnetic field, and the NMR signals are measured as time series data.

The measured NMR signals are temporarily arranged in measurement space called k space and reconstructed as an image by a two-dimensional or three-dimensional Fourier transform. In this case, when echo signals of different TE (echo time) are arranged in the k space so as to be adjacent to each other, the quality of a reconstructed image is degraded due to the characteristics of the reconstruction method. In addition, in the k space, when a TE difference between adjacent echo signals is within a predetermined range, the echo arrangement is said to be continuous.

There are various imaging methods. For example, there is multi-echo imaging in which a plurality of NMR (echo) signals (echo trains) are collected during 1 TR (repetition time) to fill the k space after one excitation pulse (90° pulse) application. In the multi-echo imaging, a plurality of regions of the k space can be filled by one excitation pulse application. In such multi-echo imaging, the echo arrangement has been studied in various ways in order to obtain a desired contrast image while maintaining the continuity of the echo arrangement (for example, refer to PTL 1 and NPL 1).

In addition, there is multi-echo multi-contrast imaging in which a plurality of k spaces are filled using a plurality of echo signals, which are collected by the multi-echo imaging, to reconstruct a plurality of different contrast images. Such multi-echo multi-contrast imaging can be accelerated by sharing (echo sharing) some of the filled echo signals between the k spaces (for example, refer to PTL 2).

CITATION LIST

Patent Literature

[PTL 1] U.S. Patent Application Publication No. 2009/0082656
[PTL 2] JP-A-5-192313

Non Patent Literature

[NPL 1] Reed F. Busse, et al. Effects of Refocusing Flip Angle Modulation and View Ordering in 3D Fast Spin Echo. Magnetic Resonance in Medicine 60:640-649 (2008)

SUMMARY OF INVENTION

Technical Problem

However, if the number of echo shares is increased, the speed is increased, but the number of locations where the echo arrangement becomes discontinuous is increased. As a result, an image is degraded. In addition, since the methods disclosed in PTL 1 and NPL 1 focus on maintaining the continuity of the echo arrangement in one k space, the continuity of the echo arrangement in a plurality of k spaces is not taken into consideration. Therefore, it is difficult to apply these methods to multi-contrast imaging.

For example, when performing multi-contrast imaging for acquiring two types of images of a proton-weighted image (PDw) and a T2-weighted image (T2w), if the echo arrangement of PDw is determined using the methods disclosed in PTL 1 and NPL 1, T2 relaxation progresses too far. Accordingly, it is possible to acquire echoes for T2w.

If the number of echoes used for PDw is reduced, echoes for T2w can also be acquired. In this case, however, the imaging time is increased since the number of echoes acquired during 1 TR is reduced.

The present invention has been made in view of the above-described situation, and it is an object of the present invention to provide a technique for improving the image quality while suppressing an increase in imaging time in multi-echo multi-contrast imaging.

Solution to Problem

The present invention determines the arrangement order of echo signals, which form an echo train, and k space filled with each echo signal such that the continuity of the echo arrangement is maintained while sharing an echo signal between contrasts in multi-echo multi-contrast imaging. Echo trains that perform echo sharing are arranged in non-oscillatory centric view ordering (NOCO). In addition, the starting point of echo sharing of one echo train is connected to the same position of another echo train. When some discontinuous regions are present, the discontinuous regions may be corrected using continuous data of regions symmetrical thereto on the k space.

Specifically, there is provided a magnetic resonance imaging apparatus that reconstructs a plurality of different contrast images from a plurality of echo trains, which are collected by operating each unit according to a pulse sequence defined by imaging parameters, while sharing an echo signal. The magnetic resonance imaging apparatus includes a sequence determination unit configured to determine an echo arrangement order of echo signals, which form the plurality of echo trains, on a trajectory of k space and k space to be filled such that echo time of an echo signal or continuity of a signal strength is maintained in each k space filled with echo signals, which reconstruct each contrast image, and determining the pulse sequence such that echo signals are arranged on a trajectory of each k space in the determined echo arrangement order.

In addition, specifically, there is provided a multi-echo multi-contrast imaging method of reconstructing a plurality of different contrast images from a plurality of echo trains, which are collected by operating a pulse sequence for measuring an echo train including a plurality of echo signals multiple times, while sharing an echo signal. The multi-echo multi-contrast imaging method includes: a step of determining an echo arrangement order of echo signals, which form the plurality of echo trains, on a trajectory of k space and k space to be filled such that echo time of an echo signal or continuity of a signal strength is maintained in each k space filled with echo signals, which reconstruct each contrast image; and a sequence determination step of determining the pulse sequence such that echo signals are arranged on a trajectory of each k space in the determined echo arrangement order.

In addition, the echo arrangement order is an arrangement order on the k space trajectory scanned by a plurality of echo trains. In addition, the arrangement or the trajectory on the k space in this specification means an arrangement or a trajectory when a lead-out direction (for example, within the phase-slice plane) is not considered.

Advantageous Effects of Invention

According to the present invention, it is possible to improve the image quality while suppressing an increase in imaging time in multi-echo multi-contrast imaging.

DESCRIPTION OF EMBODIMENTS

First Embodiment

Figure 1:
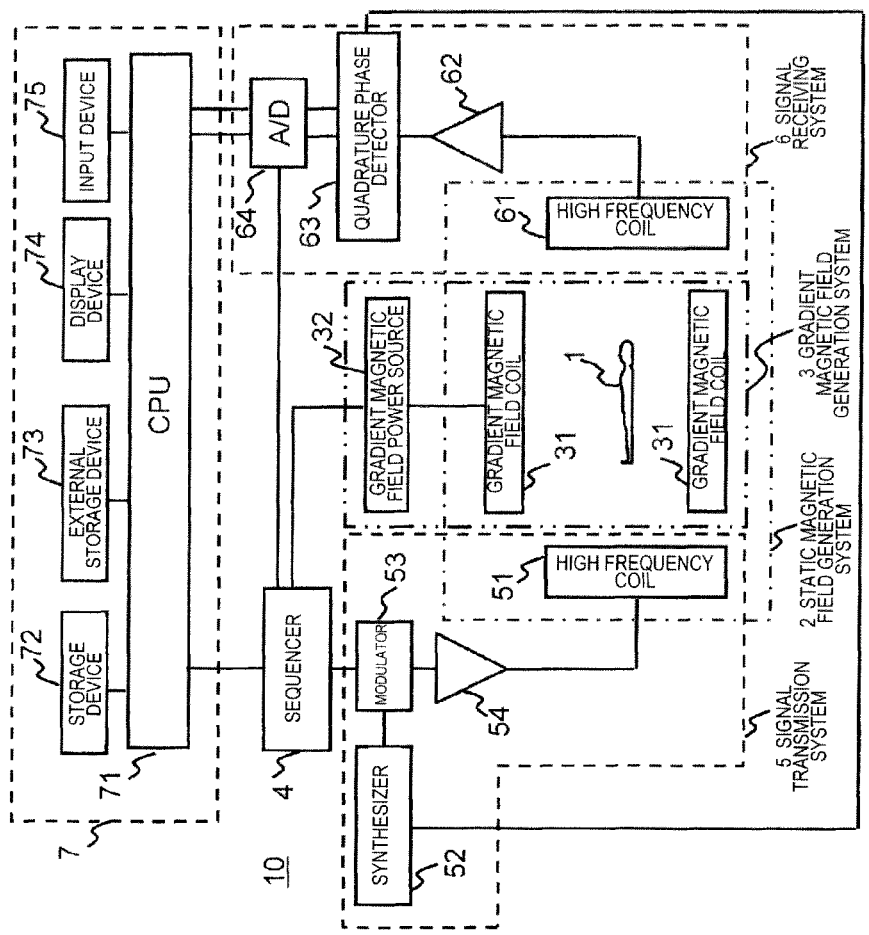
FIG. 1 is a block diagram of an MRI apparatus of a first embodiment.

Hereinafter, a first embodiment to which the present invention is applied will be described. Hereinafter, in all drawings for explaining the embodiments of the present invention, the same reference numerals are given to elements having the same functions, and repeated explanation thereof will be omitted.

First, an MRI apparatus of the present embodiment will be described. FIG. 1 is a block diagram showing the entire configuration in an example of an MRI apparatus 10 of the present embodiment. As shown in this drawing, the MRI apparatus 10 of the present embodiment acquires a tomographic image of an object 1 using an NMR phenomenon, and includes a static magnetic field generation system 2, a gradient magnetic field generation system 3, a sequencer 4, a signal transmission system 5, a signal receiving system 6, and an information processing system 7.

The static magnetic field generation system 2 generates a uniform static magnetic field in the space around the object 1 in the body axis direction or in a direction perpendicular to the body axis, and is formed by a permanent magnet type, normal conduction type, or superconducting type magnetic field generating means disposed around the object 1. In addition, generating the static magnetic field in a direction perpendicular to the body axis in the space around the object 1 is called a vertical magnetic field method, and generating the static magnetic field in the body axis direction in the space around the object 1 is called a horizontal magnetic field method.

The gradient magnetic field generation system 3 includes gradient magnetic field coils 31 wound in three axial directions of X, Y, and Z and a gradient magnetic field power source 32 which drives each gradient magnetic field coil and applies gradient magnetic field pulses, which have components in the three axial directions of X, Y, and Z, to the object 1 by driving the gradient magnetic field power source 32 of each coil according to a co and from the sequencer 4, which will be described later. For example, the slice plane for the object 1 is set by applying a slice-direction gradient magnetic field pulse (Gs) in one direction of X, Y, and Z, and positional information in each direction is encoded in an echo signal by applying a phase-encoding-direction gradient magnetic field pulse (Gp) and a frequency-encoding-direction gradient magnetic field pulse (Gf) in the remaining two directions.

The signal transmission system 5 applies a high frequency magnetic field (RF) pulse in order to cause nuclear magnetic resonance in the nuclear spins of atoms which form the body tissue of the object 1, and is configured to include a high frequency oscillator (synthesizer) 52, a modulator 53, a high frequency amplifier 54, and a transmission-side high frequency coil (transmission coil) 51. A high frequency pulse output from the high frequency oscillator 52 is amplitude-modulated by the modulator 53 at a timing based on a command from the sequencer 4, and the amplitude-modulated high frequency pulse is amplified by the high frequency amplifier 54 and is then supplied to the transmission coil 51 disposed near the object 1. As a result, the high frequency pulse is applied to the object 1 as an RF pulse.

The signal receiving system 6 detects an NMR signal (echo signal) emitted by nuclear magnetic resonance of the nuclear spins of atoms, which form the body tissue of the object 1, and includes a receiving-side high frequency coil (receiving coil) 61, an amplifier 62, a quadrature phase detector 63, and an A/D converter 64. An echo signal of a response of the object 1 induced by the RF pulse applied from the transmission coil 51 is detected by the receiving coil 61 disposed near the object 1 and amplified by the amplifier 62. Then, the amplified signal is divided into two signals perpendicular to each other by the quadrature phase detector 63 at a timing based on the command from the sequencer 4, and each of the divided signals is converted into a digital amount by the A/D converter 64 and transmitted to the information processing system 7 as a reception signal.

The sequencer 4 is control means for applying an RF pulse and a gradient magnetic field pulse repeatedly according to a predetermined photographing sequence, and operates under the control of the information processing system 7 to transmit various commands, which are required to collect data of a tomographic image of the object 1, to the signal transmission system 5, the gradient magnetic field generation system 3, and the signal receiving system 6. A photographing sequence is created in advance according to the measurement purpose and is stored as a program and data in a storage device 72 or the like, which will be described later, within the information processing system 7.

The information processing system 7 performs control of the operation of the entire MRI apparatus 10, signal processing, image reconstruction processing, and the like, and includes a CPU 71, the storage device 72 such as a ROM or a RAM, an external storage device 73 such as an optical disc or a magnetic disk, a display device 74 such as a display, and an input device 75 such as a mouse, a track ball, or a keyboard. When a received signal from the signal receiving system 6 is input, the CPU 71 executes signal processing and image reconstruction processing, and displays a tomographic image of the object 1 obtained as the result on the display device 74 and also records it in the storage device 72 or the external storage device 73. In addition, the information processing system 7 gives a command to the sequencer 4 according to the pulse sequence stored in advance in the storage device 72 or the like and the photographing sequence configured by the photographing parameter set by the user.

In addition, in FIG. 1, the transmission coil 51, the receiving coil 61, and the gradient magnetic field coil 9 are provided in the static magnetic field space of the static magnetic field generation system 2, in which the object 1 is inserted, such that they face the object 1 in the case of a vertical magnetic field method and they surround the object 1 in the case of a horizontal magnetic field method. In addition, the receiving coil 61 is provided so as to face or surround the object 1.

In addition, although the case where the transmission coil 51 and the receiving coil 61 are separately provided is exemplified, the present invention is not limited thereto. For example, high frequency coil 51 or 61 may be configured to have both the functions.

The MRI apparatus 10 having the above configuration photographs the shapes or functions of the head, abdomen, limbs, and the like of the human body in a two-dimensional or three-dimensional manner by imaging the spatial distribution of the density of spin species to be photographed or the spatial distribution of excited-state relaxation. In addition, the spin species to be photographed which are widely used clinically are a proton which is a main component material of the object.

In the present embodiment, a plurality of images having different echo time (TE) are acquired by multi-echo imaging. The information processing system 7 of the present embodiment generates an imaging sequence of the present embodiment from the pulse sequence capable of realizing multi-echo imaging, which is stored in the storage device 72 in advance, and the imaging parameter input through the input device 75 from the user. In particular, in the present embodiment, the arrangement order of echo signal groups, which form the echo train, on each k space trajectory is determined. In addition, the amount of gradient magnetic field application, which defines the arrangement of echo signal groups on k space, is determined such that echo signals are arranged in the determined arrangement order, thereby setting the imaging sequence.

Figure 2:
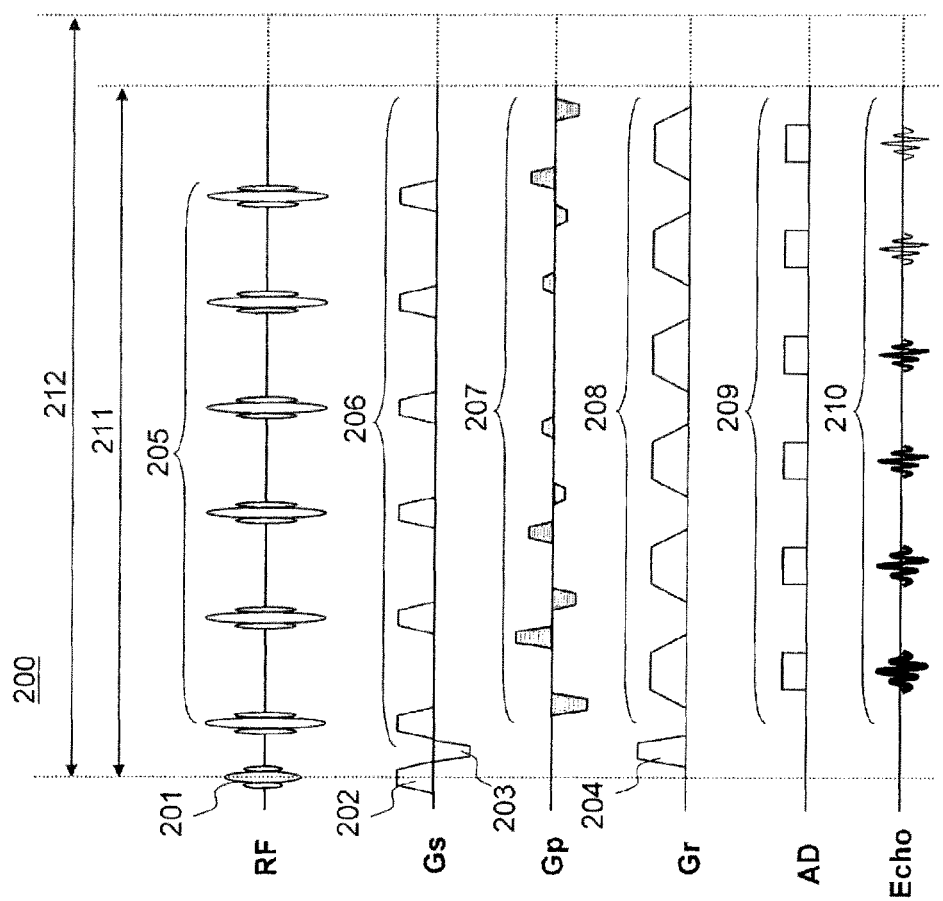
FIG. 2 is an explanatory view for explaining the pulse sequence of the 2D-FSE sequence.

Prior to explaining the generation of the imaging sequence of the present embodiment, an example of the pulse sequence used in multi-echo imaging will be described. FIG. 2 is a 2D-FSE sequence 200 of the example.

In this drawing, RF, Gs, Gp, Gf, AD, and Echo indicate axes of an RF pulse, a slice gradient magnetic field, a phase encoding gradient magnetic field, a frequency encoding gradient magnetic field, AD conversion, and an echo signal, respectively. In addition, a case of collecting six echo signal groups every single excitation RF pulse will be described as an example herein. In addition, as described above, an echo signal group acquired during 1 TR (repetition time) after one excitation RF pulse application is called an echo train. In addition, the number of echo signals which form an echo train is called an echo train number (ETL). In this example, the echo train number is 6.

In the 2D-FSE sequence 200, an excitation RF pulse 201 for giving a high frequency magnetic field to the spins within the photographing plane and a slice selection gradient magnetic field pulse 202 are applied first. A slice re-phase pulse 203 for returning the phase of the spins diffused by the slice selection gradient magnetic field pulse 202 and a frequency dephase gradient magnetic field pulse 204, which distributes the phase of the spins in advance in order to generate an echo signal, are applied immediately after the application of the slice selection gradient magnetic field pulse 202. Then, a reverse RF pulse 205 for reversing the spins within the slice plane is repeatedly applied. In addition, a slice selection gradient magnetic field pulse 206 for selecting a slice, a phase encoding gradient magnetic field pulse 207, and a frequency encoding gradient magnetic field pulse 208 are applied for each application of the reverse RF pulse 205, and an echo signal 210 is collected at a timing of a sampling window 209. Here, since this is an example where the echo train number is 6 as described above, the reverse RF pulse 205 is applied six times. In addition, echo signals which form the echo signal group 210 are generally collected as time-series signals with 128, 256, 512 or 1024 items of sampling data at the timing of each sampling window 209.

A time interval from the application of one excitation RF pulse 201 to the application of the next excitation RF pulse 201 is called TR 211. In addition, in the FSE sequence, a period from the application of an excitation RF pulse to the collection of all echo signal groups within 1 TR is called unit measurement (shot). In photographing using the 2D-FSE sequence 200, all echo signals 210 required for an image are collected at time intervals 212 by repeating a shot while changing the amount of application of the phase encoding gradient magnetic field pulse 207 group every TR 211. As the number of echo signals to be collected, a value of 64, 128, 256, 512, or the like per image is usually selected.

Here, a number indicating the order of acquisition of an echo number within the same TR 211 is called an echo number. In addition, an echo signal with an echo number of N is called an N-th echo signal.

In addition, types of echo trains are divided according to in which order echo signals, which form the echo train, are aligned in each arrangement group on the k space trajectory (according to the echo arrangement order). The arrangement group on the trajectory of k space is a region of each echo train having a predetermined width in a trajectory direction of the k space where each echo signal is arranged. In addition, the origin ($k_{traj}$=0) on the k space trajectory is defined as a point within an arrangement group including the origin on the k space. Hereinafter, echo trains with the same echo arrangement order are called echo trains of the same type. On the contrary, echo trains with different echo arrangement orders are called echo trains of different types.

In addition, the arrangement position of each echo signal, which forms one echo train 210, on the k space trajectory is determined by the amount of application of the gradient magnetic field (in the example of FIG. 2, the amount of application of the phase encoding gradient magnetic field pulse 207). In this case, each echo signal is arranged in a lower spatial frequency region on the k space trajectory as the amount of application of the phase encoding gradient magnetic field pulse decreases. Therefore, determining the echo arrangement order is, that is, determining a method of changing the amount of application of the gradient magnetic field in one shot in a pulse sequence.

Figure 3:
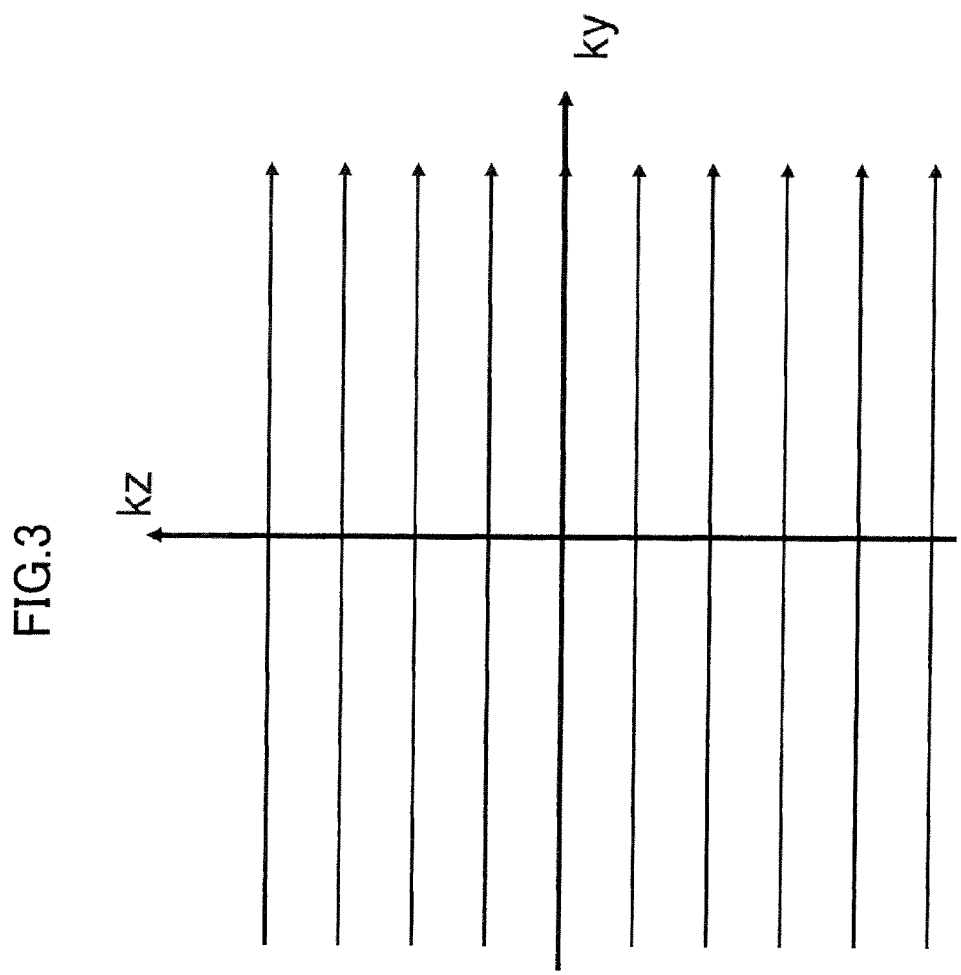
FIG. 3 is an explanatory view for explaining the k space trajectory using the orthogonal FSE sequence.

In addition, in the case of 3D imaging, the above-described FSE sequence 200 is further repeated while changing the amount of application of the slice selection gradient magnetic field pulse 202, thereby collecting images in the slice direction. FIG. 3 shows a trajectory on the yz plane (phase-slice plane) of k space in the case of such a scan (raster scan).

In addition, pulse sequences used in the multi-echo imaging include not only the above-described FSE method but also an EPI method and the like. The present embodiment can be applied to all imaging methods for realizing the multi-echo imaging without being limited to these.

In the present embodiment, a plurality of contrast images with different TE are acquired. For this reason, in the present embodiment, for each contrast of an image to be acquired, a low spatial frequency region of k space to reconstruct each image using an echo train with an optimal echo arrangement order is filled. In this case, the continuity of TE of each echo signal in each k space is ensured while sharing an echo signal by studying the echo arrangement order of each echo train. In this manner, the continuity of signal characteristics, such as echo time or signal strength of the echo signal, is ensured. Hereinafter, a contrast image having echo time of TE is called a TE image in this specification. In addition, an echo train of the echo arrangement order, which fills a low spatial frequency region of k space that reconstructs a corresponding image, is called an echo train for TE images.

Figure 4:
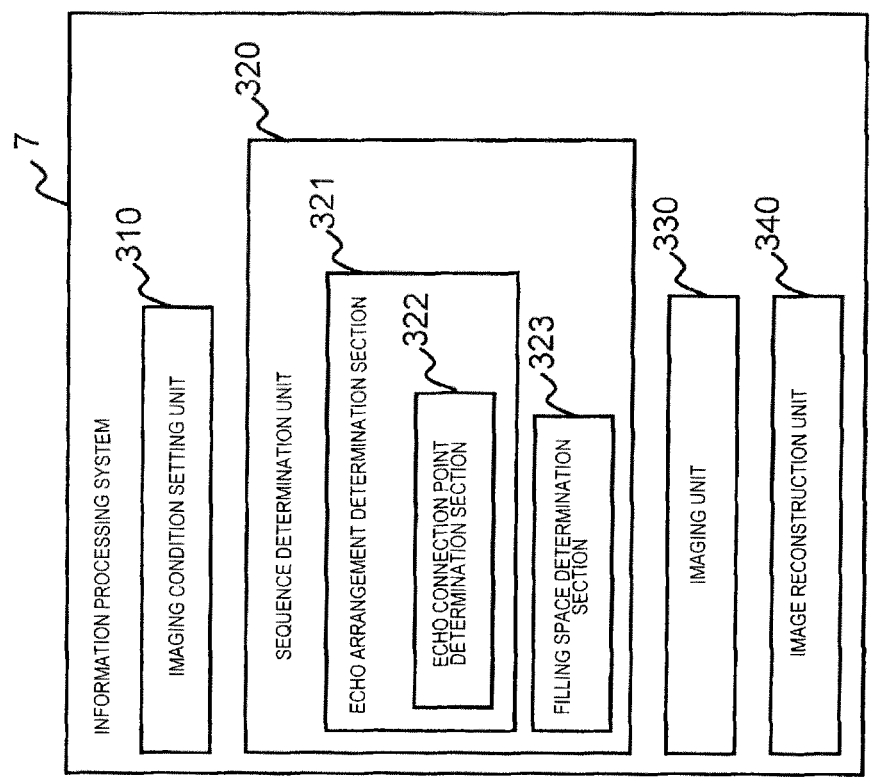
FIG. 4 is a functional block diagram of an information processing system of the first embodiment.

FIG. 4 is a functional block diagram of the information processing system 7 of the present embodiment. As shown in this drawing, in order to generate an imaging sequence for realizing such imaging and execute the imaging, the information processing system 7 of the present embodiment includes an imaging condition setting unit 310, a sequence determination unit 320, an imaging unit 330, and an image reconstruction unit 340.

The imaging condition setting unit 310 receives an imaging parameter input from the user through an input device. The number of echo signals which form each echo train, echo time to obtain the contrast of an image that needs to be acquired, and the like are included in the imaging parameters.

The sequence determination unit 320 determines an imaging sequence on the basis of the imaging parameters received by the imaging condition setting unit 310. The sequence determination unit 320 of the present embodiment determines the echo arrangement order of each echo train and k space, which is filled with each echo signal that forms each echo train, such that each k space used for the reconstruction of a plurality of different contrast images is filled so as to maintain the continuity of TE between echo signals while performing echo sharing.

In order to realize the above-described function, the sequence determination unit 320 includes an echo arrangement determination section 321 and a filling space determination section 323. In addition, the echo arrangement determination section 321 includes an echo connection point determination section 322, and enables a continuous echo arrangement.

Hereinafter, filling one k space with echo signals of a plurality of echo trains with different echo arrangement orders is called connecting echo trains, and an end of each echo train adjacent to another echo train when echo trains are connected is called an echo connection point. In the present embodiment, an echo connection point is specified using echo numbers of echo signals which form each echo train. In addition, a direction in which echo numbers are in the ascending order is called an arrangement direction.

The echo arrangement determination section 321 determines the arrangement of echo signals, which form an echo train, on one trajectory of k space as an echo arrangement order. In addition, the sequence determination unit 320 determines a method of giving (changing) the amount of application of the gradient magnetic field at the time of echo train collection according to this echo arrangement order. The echo arrangement order is determined from the echo train filled in a low spatial frequency region of k space for a contrast image with the shortest TE. This echo train is called a reference echo train, and echo trains other than the reference echo train are called other echo trains.

First, echo trains are continuously arranged such that the coordinates on the k space trajectory with respect to an echo signal, which is acquired at the timing closest to TE to obtain the desired contrast, becomes 0 ($k_{traj}$=0). In this case, other echo trains are continuously arranged in non-oscillatory centric view ordering against the reference echo train until an echo signal of the same number as the echo signal of the reference echo train falls in the same arrangement group or an adjacent arrangement group on the trajectory of k space.

Here, arranging the echo trains in non-oscillatory centric view ordering against the reference echo train refers to arranging echo trains in an arrangement group, in which the first echo signal of the reference echo train is arranged, sequentially in the opposite direction to the arrangement direction of the reference echo train from an arrangement group adjacent in the opposite direction to the arrangement direction of the reference echo train.

Here, in each of other echo trains, the echo connection point determination section 322 determines as an echo connection point an echo signal, which is arranged in the same arrangement group on a trajectory of k space as an echo signal of the same number of the reference echo train or in the adjacent arrangement group, in the echo arrangement order determined by the echo arrangement determination section 321.

In addition, there are many parameters related to the determination of the echo arrangement order, such as TE, echo shift, IET (Inter Echo Time), ETL, the number of phase encoding, and the number of slice encoding. Accordingly, even if TE is not designated, TE may be determined by designating other parameters (echo shift, IET, and the like). In the following examples, a case where TE is designated will be described. However, the following examples can also be applied to cases where parameters other than TE are designated by determining TE from these parameters.

In addition, although TE of an image is defined as an echo time when $k_{traj}=0$ in this application, another definition may be used (for example, contrast equivalent TE when performing FA modulation. This TE does not become an echo time when $k_{traj}=0$). In such cases, however, since TE in this application can be determined as long as there is information for determining the echo arrangement, the following examples can also be applied.

As a specific example, a case where the echo arrangement order is determined from the designated TE will be described. First, in order to obtain a contrast image with the shortest TE, the echo arrangement order of an echo train (reference echo train) for the image is determined. Here, the echo arrangement order is determined such that the amount of encoding with respect to the echo signal acquired at the timing closest to the TE becomes 0. That is, echo signals acquired at the timing closest to the TE are arranged in an arrangement group including the origin ($k_{traj}=0$) on the k space trajectory. In addition, other echo signals are sequentially arranged on the k space trajectory.

Then, the echo arrangement order of other echo trains is determined. Basically, other echo trains are arranged in the non-oscillatory centric view ordering against the reference echo train. In addition, an echo signal acquired at TE of each contrast is arranged in an arrangement group including the origin ($k_{traj}=0$) on the k space trajectory, and is arranged so as to fold at the echo connection point.

The filling space determination section 323 determines k space to be filled, for each echo signal that forms each echo train whose echo arrangement order has been determined by the echo arrangement determination section 321. That is, the filling space determination section 323 determines which contrast image is to be used for reconstruction. In the present embodiment, the filling space determination section 323 fills the k space by connecting echo signals of a plurality of echo trains at the echo connection point determined by the echo connection point determination section 322 and performing echo sharing.

Specifically, determination is performed such that, for each echo train, an echo signal group in an echo train for an image of the corresponding contrast includes an echo signal of the origin ($k_{traj}=0$) on the k space trajectory and an echo signal group whose echo numbers are continuous is filled in the k space for each contrast up to the echo connection point or the end. Then, when echo signal groups continuous to echo signals of the ends of the series of filled echo signal groups are present in an echo train other than the echo train for the image of the contrast, determination is performed such that these echo signal groups are filled in the k space for the image of the contrast. The presence of continuous echo signal groups is determined on the basis of whether or not there is an echo connection point. The specific example will be described later.

The imaging unit 330 executes a sequence according to the imaging sequence determined by the sequence determination unit 320. Then, obtained echo signals are filled in the k space, which is prepared in advance for each desired contrast and is determined by the filling space determination section 323. The image reconstruction unit 340 reconstructs an image from the echo signal filled in each k space.

Figure 5:
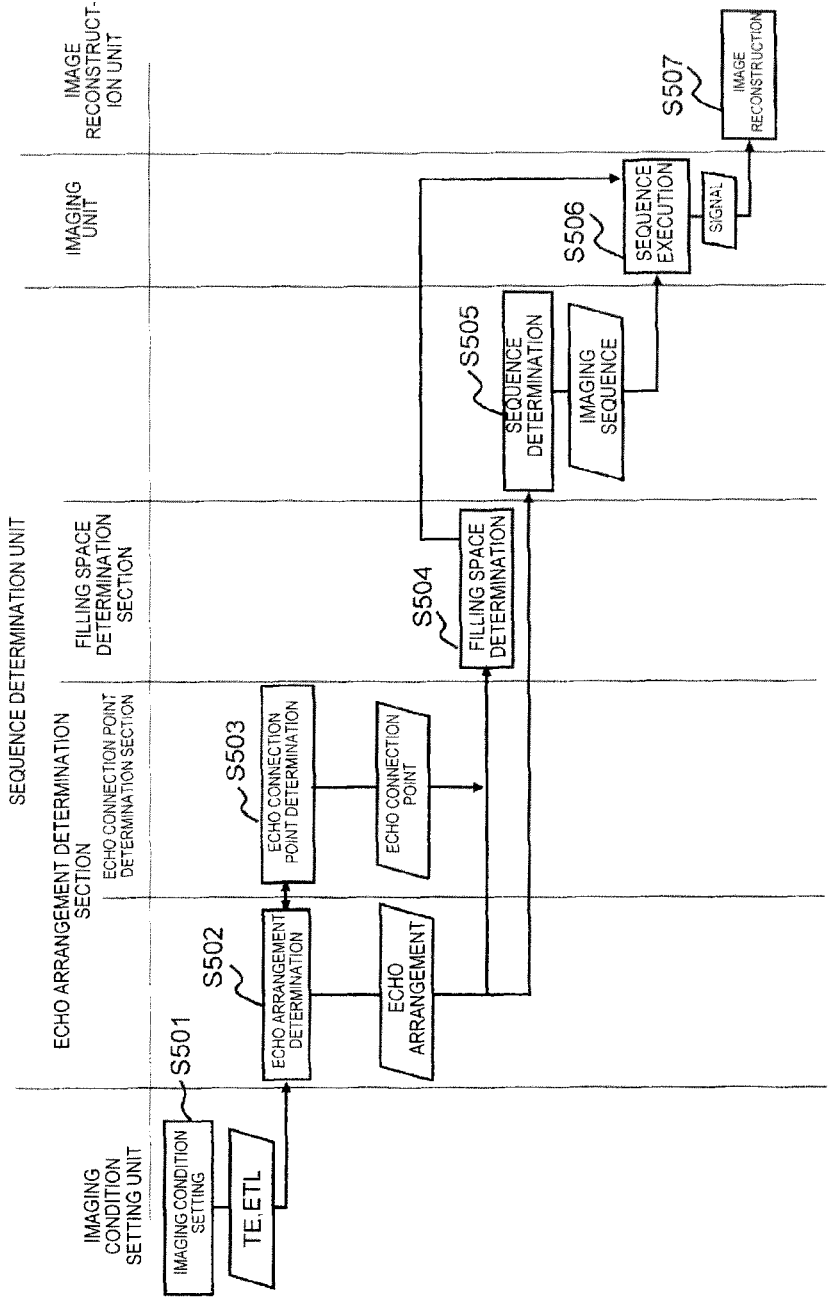
FIG. 5 is an explanatory view for explaining the flow of imaging processing of the first embodiment.

Hereinafter, the flow of imaging processing of the present embodiment, in which the sequence determination unit 320 determines an imaging sequence and k space for the filling of obtained echo signals and performs imaging, will be described. FIG. 5 is a view for explaining the flow of imaging processing of the present embodiment. Hereinafter, the imaging processing is started when the user inputs imaging conditions or when the user inputs imaging conditions and gives an instruction to start imaging.

The imaging condition setting unit 310 receives the imaging conditions that are input by the user through the input device 75 (step S501). In this case, the imaging conditions include an echo time (TE), which specifies the contrast of an image to be acquired, and the echo train number (ETL) of each echo train to be acquired.

The echo arrangement determination section 321 determines the echo arrangement order of each echo train using the received imaging conditions (step S502).

When determining the echo arrangement order, the echo connection point determination section 322 determines an echo connection point for each of other echo trains and stores the echo connection point so as to match the echo train (step S503).

Then, the filling space determination section 323 determines the filling k space of each echo signal on the basis of the determined echo arrangement order and echo connection point (step S504).

Then, the sequence determination unit 320 determines an imaging sequence to realize the determined echo arrangement order (step S505). Here, a method of giving the amount of application of the gradient magnetic field at the time of acquisition of each echo train is determined. Then, the imaging unit 330 executes imaging (sequence execution) by making the sequencer 4 operate each unit according to the determined imaging sequence and fills the k space determined in step S504 with each acquired echo signal (step S506). The image reconstruction unit 340 reconstructs an image from the k space data (step S507).

Hereinafter, the procedure of determining the echo arrangement order and the filling k space using the echo arrangement determination section 321 and the echo connection point determination section 322 will be described through a specific example. Here, a case where the k space is filled with two types of echo trains and two types of images of different contrasts are acquired will be described as an example. Two types of echo trains are assumed to be an echo train A and an echo train B, and each echo train number is set to 9. In addition, echo time TE of two types of different contrasts is set to TE1 and TE2 (TE1<TE2). It is assumed that TE1 is a timing at which a first echo signal is acquired and TE2 is a timing at which a sixth echo signal is acquired. It is assumed that the echo train A is used for the TE1 image and the echo train B is used for the TE2 image.

Figure 6:
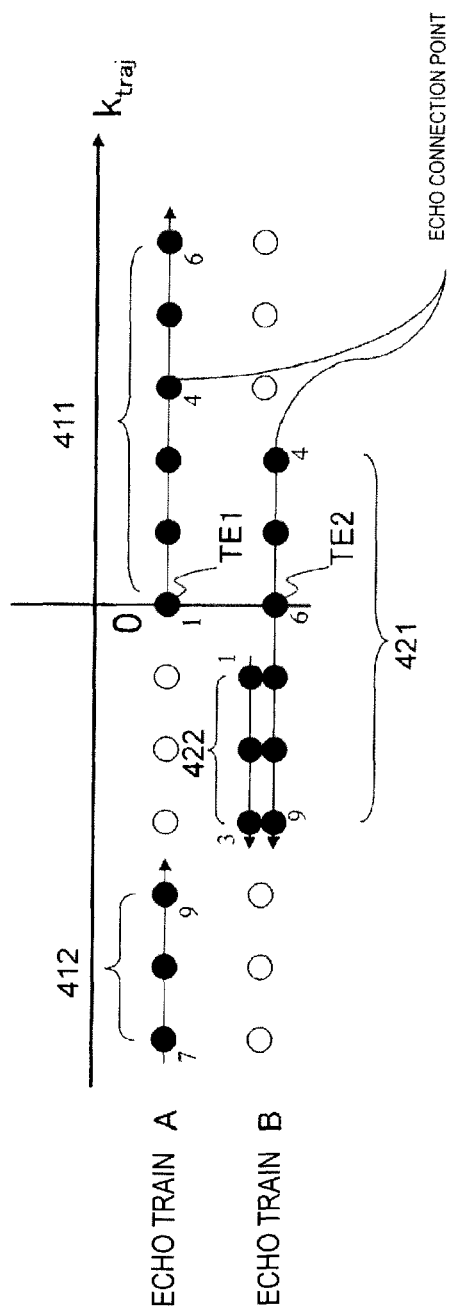
FIG. 6 is an explanatory view for explaining the echo arrangement order of an echo train of the first embodiment.

FIG. 6 is a view for explaining the echo arrangement order of echo trains in this case. The $k_{traj}$ axis in this drawing indicates a trajectory of the k space. For example, the $k_{traj}$ axis is each trajectory parallel to the ky axis in FIG. 3 described above (the same in the following drawings). In addition, a black dot is each echo signal, and the given number is an echo number.

Since TE1<TE2, the echo train A is a reference echo train. Accordingly, the echo arrangement determination section 321 determines the echo arrangement order of the echo train A first. The echo arrangement order of the echo train A is a sequential arrangement of the ascending order on the k space trajectory, and is determined such that echo signals acquired at the timing closest to TE1 are arranged in the arrangement group including the origin ($k_{traj}=0$) on the k space trajectory. Since the timing at which the first echo signal is acquired is TE1 herein, echo signals are sequentially arranged in ascending order on the k space trajectory such that the first echo signal is arranged in the arrangement group including the origin ($k_{traj}=0$) on the k space trajectory, as shown in FIG. 6 (411). After the arrangement up to the arrangement group (sixth echo signal) of the end, the process returns to the arrangement group of the opposite end to arrange echo signals in the same direction and same order from the seventh echo signal (412).

Then, the echo arrangement determination section 321 determines the echo arrangement order of the echo train B as other echo trains. As described above, the echo arrangement order of the echo train B is determined so as to be non-oscillatory centric view ordering against the echo train A and such that the echo signal (sixth echo signal) acquired at the timing closest to TE2 is arranged in the arrangement group of $k_{traj}=0$.

Specifically, the echo arrangement determination section 321 arranges echo signals on the k space trajectory sequentially in descending order of echo numbers from the ninth echo signal such that echo numbers on the k space trajectory are sequentially arranged in descending order and the sixth echo signal is arranged in the arrangement group including the origin ($k_{traj}=0$) on the k space trajectory (421). In this case, each echo signal of the echo train B is arranged until the echo number of the same arrangement group or the adjacent arrangement group on the k space trajectory matches the echo number of the echo train A. In FIG. 6, echo signals up to the fourth echo signal are arranged.

Here, the echo connection point determination section 322 determines the fourth echo signal as an echo connection point of the echo train B and stores it so as to match the echo train B. In addition, since the ninth echo signal of the echo train B is also continuous with the ninth echo signal of the echo train A, the echo connection point determination section 322 determines it as a connection point and stores it so as to match the echo train B.

The echo arrangement determination section 321 arranges echo signals before the echo connection point, that is, first to third echo signals in the arrangement group, in which the first echo signal of the echo train A is arranged, while performing increment in the opposite direction on the k space trajectory from the arrangement group, which is adjacent to the opposite direction to the arrangement direction of the echo train A (422).

Here, since the first echo signal of the echo train A and the first echo signal of the echo train B are arranged in non-oscillatory centric view ordering, the first echo signal of the echo train A is continuous with the first echo signal of the echo train B. Accordingly, the first echo signal of the echo train A is also determined as an echo connection point and stored so as to match the echo train A.

As described above, after determining the echo arrangement order, the filling space determination section 323 determines in which k space for an image of which contrast each echo signal should be filled. Here, the filling space determination section 323 determines which echo signal is to be used for which image. In addition, the filling k space of each echo signal is determined. This determination method will be described using FIG. 7.

For the TE1 image, first, the echo signal group (411) from the head to the sixth echo signal of the echo train A is used. This is because the echo signal group of the echo train A is an echo signal group of the echo train for the TE1 image and echo signals acquired at the timing closest to TE1 are a series of echo signal groups arranged in the arrangement group including the origin ($k_{traj}=0$) on the k space trajectory. In addition, since the first echo train is stored as a connection point of the echo train A, a series of echo signal groups (422) starting from the first echo signal of the echo train B continuous to this are also used for the TE1 image.

Therefore, the filling k space of the echo signal group (411) from the head to the sixth echo signal of the echo train A and a series of echo signal groups (422) starting from the first echo signal of the echo train B is determined as k space prepared for the TE1 image. This is the same hereinbelow.

For the TE2 image, first, the echo signal group (421) from the echo connection point to the end of the echo train B is used. This is because the echo signal group of the echo train B is an echo signal group of the echo train for the TE2 image and echo signals acquired at the timing closest to TE2 are a series of echo signal groups arranged in the arrangement group including the origin ($k_{traj}=0$) on the k space trajectory. In addition, since the fourth and ninth echo trains are stored as connection points of the echo train B, the fourth echo signal group to the sixth (end) echo signal group of the echo train A and the seventh (end) echo signal group to the ninth echo signal group of the echo train A (412), which continue these, are also used for the TE2 image. In addition, the fourth to sixth echo signal groups of the echo train A are shared between the TE1 and TE2 images.

In the case of this example, in the k space for the TE1 image, echo signals equivalent to left three echoes are not filled. Such a region is filled with zero-fill or by estimation. In addition, all acquired echo signals may not be used for image reconstruction.

Next, a case where the k space is filled with three types of echo trains and three types of images of different contrasts are acquired will be described as an example. Three types of echo trains are assumed to be an echo train A, an echo train B, and an echo train C, and each echo train number is set to 11, 9, and 11. In addition, each echo time TE of three types of different contrasts acquired is set to TE1, TE2, and TE3 (TE1<TE2<TE3). In addition, it is assumed that TE1 is a timing at which the first echo signal is acquired, TE2 is a timing at which the sixth echo signal is acquired, and TE3 is a timing at which the tenth echo signal is acquired. In addition, it is assumed that the echo train A is used for the TE1 image, the echo train B is used for the TE2 image, and the echo train C is used for the TE3 image.

Figure 8:
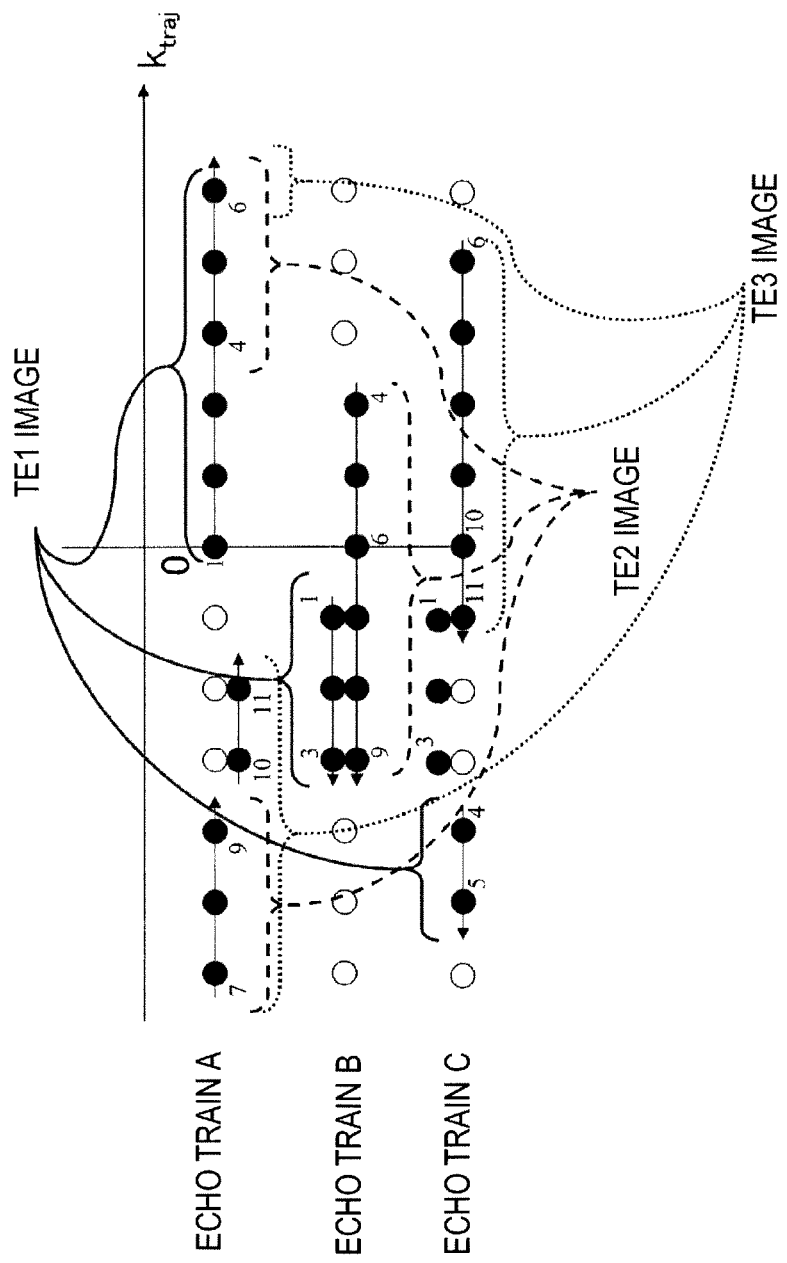
FIG. 8 is an explanatory view for explaining the echo arrangement order of an echo train and an echo signal used in each contrast image when acquiring three types of contrast images with three types of echo trains in the first embodiment.

FIG. 8 is a view for explaining the echo arrangement order determination method and the filling k space determination method in this case. Also in this example, since TE1<TE2<TE3, the echo train A is a reference echo train. In addition, the echo trains B and C are other echo trains.

First, the echo arrangement determination section 321 determines the echo arrangement order of the echo trains A and B in the same procedure as in the above-described case of two types. Here, in the echo train A, echo signals up to the eleventh echo signal are arranged. In this case, the echo connection point determination section 322 determines and stores the echo connection point in a similar manner.

Then, the echo arrangement determination section 321 determines the echo arrangement order of the echo train C. Similar to the echo train B, the echo arrangement order of the echo train C is determined so as to be non-oscillatory centric view ordering against the echo train A and such that the echo signal (tenth echo signal) acquired at the timing closest to TE3 is arranged in the arrangement group including the origin ($k_{traj}=0$) on the k space trajectory.

That is, the echo arrangement determination section 321 arranges echo signals on the k space trajectory in the opposite direction sequentially in descending order of echo numbers from the eleventh echo signal such that echo numbers on the k space trajectory are sequentially arranged in descending order and the tenth echo signal is arranged in the arrangement group including the origin ($k_{traj}=0$) on the k space trajectory. In this case, each echo signal of the echo train C is arranged until the echo number of the same arrangement group or the adjacent arrangement group on the k space trajectory matches the echo number of the echo signal of the echo train A. In FIG. 8, echo signals up to the sixth echo signal are arranged.

Here, the echo connection point determination section 322 determines the sixth echo signal as an echo connection point of the echo train C and stores it so as to match the echo train C. In addition, since the eleventh echo signal of the echo train C is also continuous with the eleventh echo signal of the echo train A, the echo connection point determination section 322 determines it as an echo connection point and stores it so as to match the echo train C.

The echo arrangement determination section 321 arranges echo signals before the echo connection point of the echo train C, that is, first to fifth echo signals in the arrangement group, in which the first echo signal of the echo train A is arranged, while performing increment in the opposite direction on the k space trajectory from the arrangement group in which the first echo signal of the echo train A is arranged.

As described above, after determining the echo arrangement order, the filling space determination section 323 determines in which image each echo signal is to be used, and determines the k space to be filled. This method will be similarly described using FIG. 8.

The TE1 and TE2 images are the same as those when the two types of echo trains described above are used. Here, for the TE1 image, fourth and fifth echo signals of the echo train C may be further used. Alternatively, it is also possible to use the first to third echo signals of the echo train C instead of the first to third echo signals of the echo train B. Alternatively, both the signals may be averaged to obtain the SNR.

For the TE3 image, first, an echo signal group from the echo connection point to the end of the echo train C is used. This is because the echo signal group of the echo train C is an echo signal group of the echo train for the TE3 image and echo signals acquired at the timing closest to TE3 are a series of echo signal groups arranged in the arrangement group including the origin ($k_{traj}=0$) on the k space trajectory. In addition, since the sixth and eleventh echo signals are stored as echo connection points of the echo train C, the sixth (end) echo signal of the echo train A and the seventh (end) echo signal group to the eleventh echo signal group of the echo train A, which continue these, are also used for the TE3 image. In addition, the sixth echo signal of the echo train A is shared between the TE1 and TE3 images. In addition, the seventh to ninth echo signals of the echo train A are shared between the TE2 and TE3 images.

In addition, also in this example, all acquired echo signals may not be used for image reconstruction.

In addition, although the echo train number (ETL) of the echo train B is set to 9 in this example, it may be set to 11. In this case, the echo arrangement determination section 321 arranges the tenth and eleventh echo signals of the echo train B in the same manner as in the echo train A. The similar arrangement is arranging the tenth and eleventh echo signals of the echo train B in the same arrangement group as the tenth and eleventh echo signals of the echo train A. In addition, the filling space determination section 323 fills the tenth and eleventh echo signals of the echo train B in the same manner as in the echo train A. That is, the tenth and eleventh echo signals of the echo train B are used for the TE3 image.

In addition, only one echo signal, which is arranged so as to overlap in the same arrangement group, may be used, or the SNR may be obtained by averaging.

In addition, the imaging unit 330 executes the imaging sequence for each echo train, which is determined by the sequence determination unit 320, to acquire an image. There is no restriction in the order of acquisition of these echo trains. In addition, the k space is generally filled by executing each echo train a plurality of shots. The execution order of each shot is also arbitrary.

Figure 9:
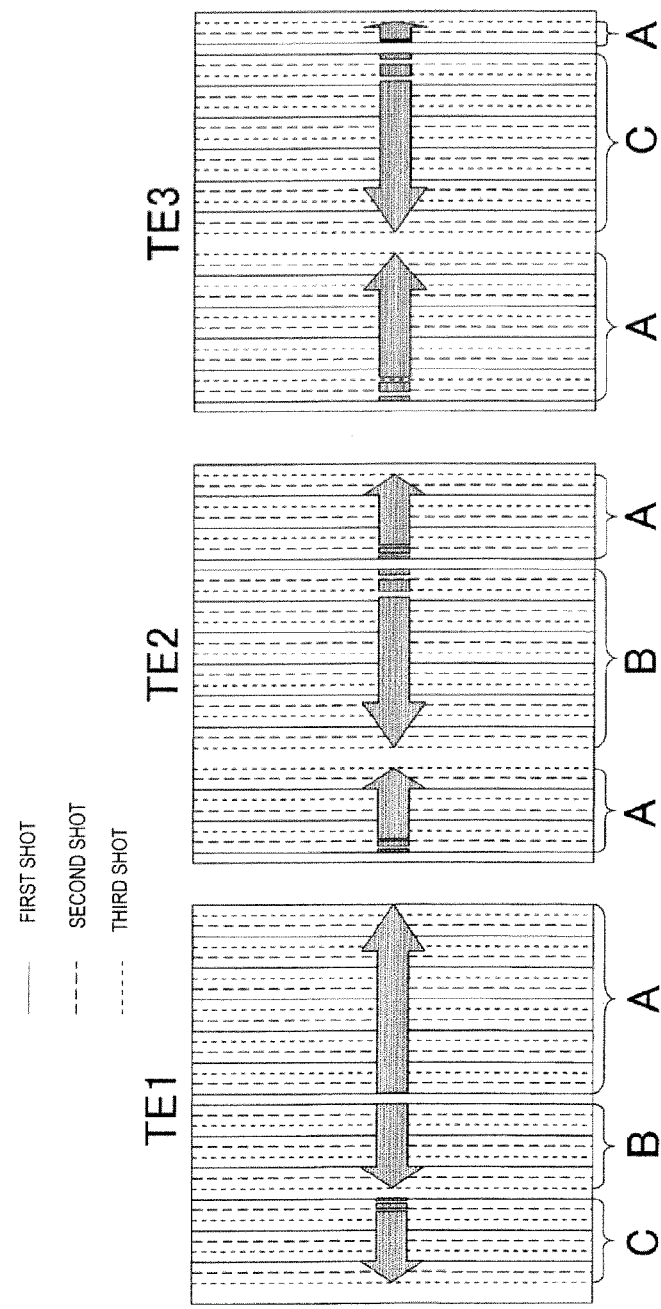
FIG. 9 is an explanatory view for explaining the echo arrangement when filling the k space with three kinds of echo trains (three shots in each echo train) in the first embodiment.

As an example, FIG. 9 shows a state where each k space is filled with echo trains of three shots when acquiring each contrast image of TE1, TE2, and TE3 with the three types of echo trains shown in FIG. 8 (echo trains A, B, and C are denoted as A, B, and C). In this drawing, a solid line indicates a first shot of each echo train, a broken line indicates a second shot, and a dotted line indicates a third shot. Each arrangement group of each k space is formed by three lines. In addition, the arrow indicates an echo arrangement order of echo number ascending order of each echo train.

Figure 10:
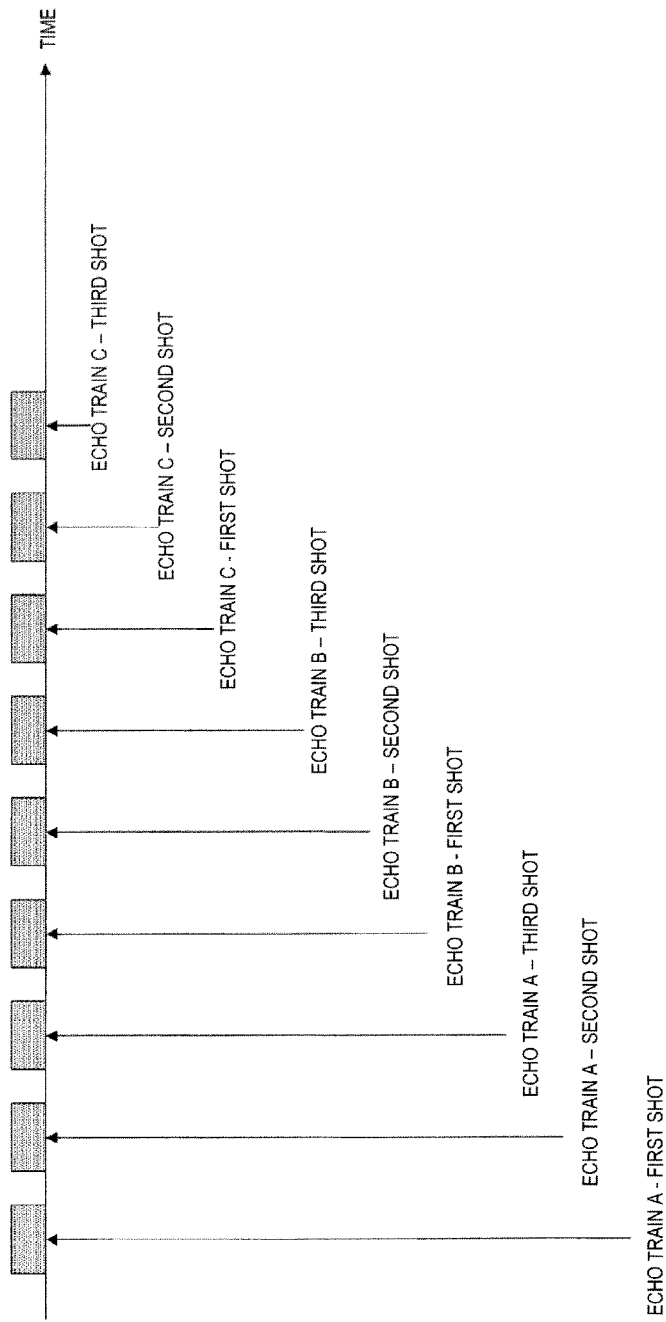
FIG. 10 is an explanatory view for explaining the order of acquisition of each shot of each echo train in the example shown in FIG. 9 in the first embodiment.
Figure 11:
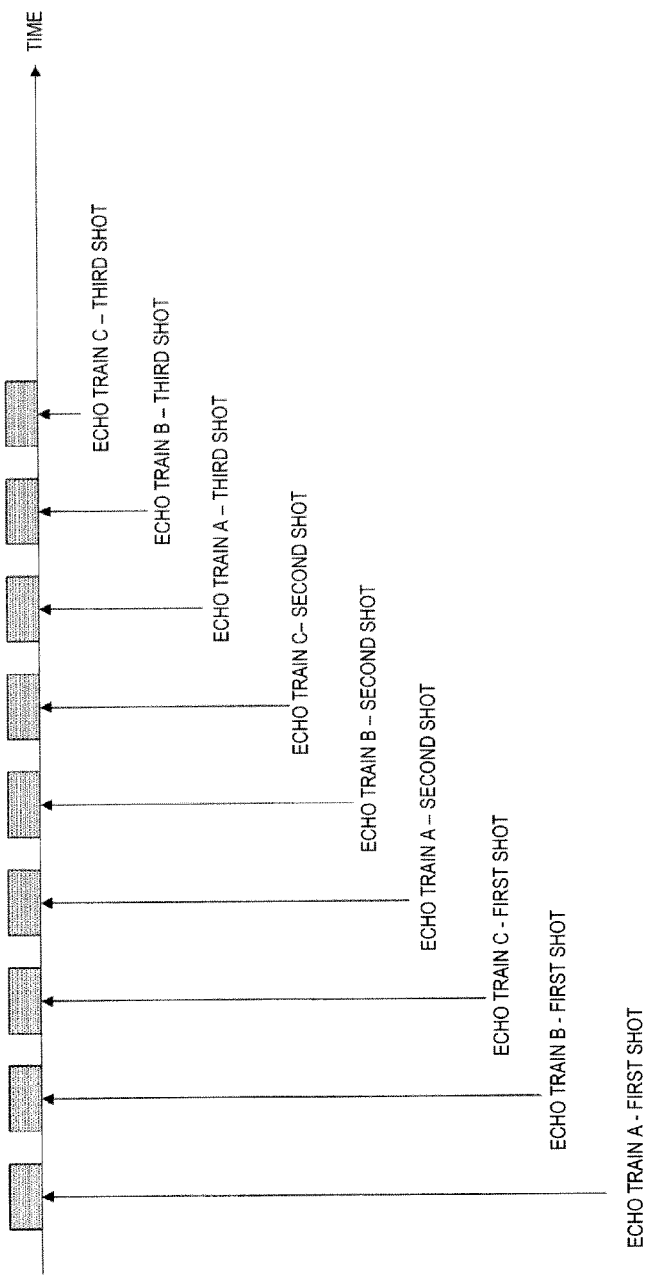
FIG. 11 is an explanatory view for explaining the order of acquisition of each shot of each echo train in the example shown in FIG. 9 in the first embodiment.

FIGS. 10 and 11 are views for explaining examples of the acquisition order of each shot of each echo train in this case. As shown in FIG. 10, the next echo train may be acquired after acquiring all shots for each echo train. In addition, as shown in FIG. 11, for each echo train, one shot of the next echo train may be acquired for each shot acquisition. Undoubtedly, the acquisition order is not limited to these.

As described above, according to the present embodiment, echo signals that form each echo train may be filled in the k space for each contrast image as described above. Therefore, echoes of echo trains of the same echo number, which share an echo signal, are connected to the starting point of echo sharing. For this reason, even in a case where an echo is shared between echo trains, echo time of an echo signal or the continuity of the signal strength in each k space is ensured. In this manner, it is possible to prevent the degradation of image quality due to discontinuities of the echo arrangement at the time of echo sharing. Therefore, according to the present embodiment, it is possible to reduce the imaging time per one contrast image without degrading the image quality. In addition, it is possible to improve the image quality by reducing the number of echo trains without increasing the imaging time per one contrast image.

In particular, the present embodiment is optimal for multi-echo multi-contrast imaging when the echo train is long, such as three-dimensional imaging. In general, if the number of shared echo signals is not increased according to the length of the echo train, the effect of echo sharing is reduced. However, when a large number of echo signals are shared, if the echo sharing is simply performed, the echo time (signal strength) of echo signals arranged on the k space becomes discontinuous, and the image quality is degraded. However, according to the present embodiment, a plurality of echo signals are shared between contrasts while maintaining the continuity of the echo arrangement. Therefore, it is possible to avoid the degradation of the image quality while suppressing an increase in the entire echo train number.

Figure 12:
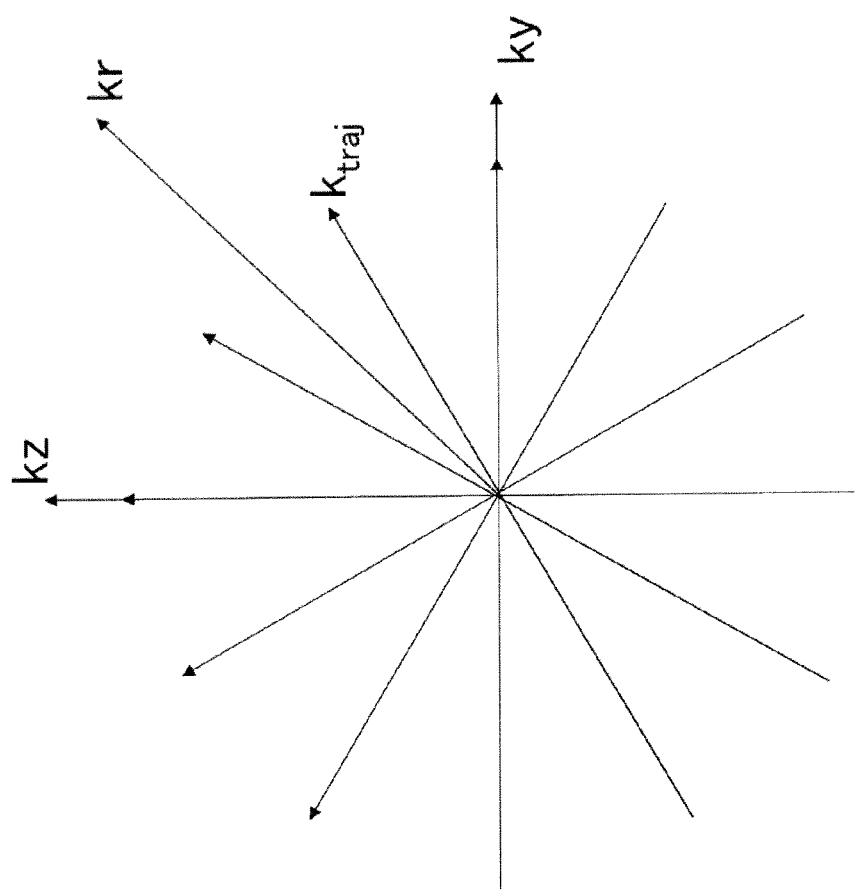
FIG. 12 is an explanatory view for explaining the k space trajectory of a radial scan.
Figure 13:
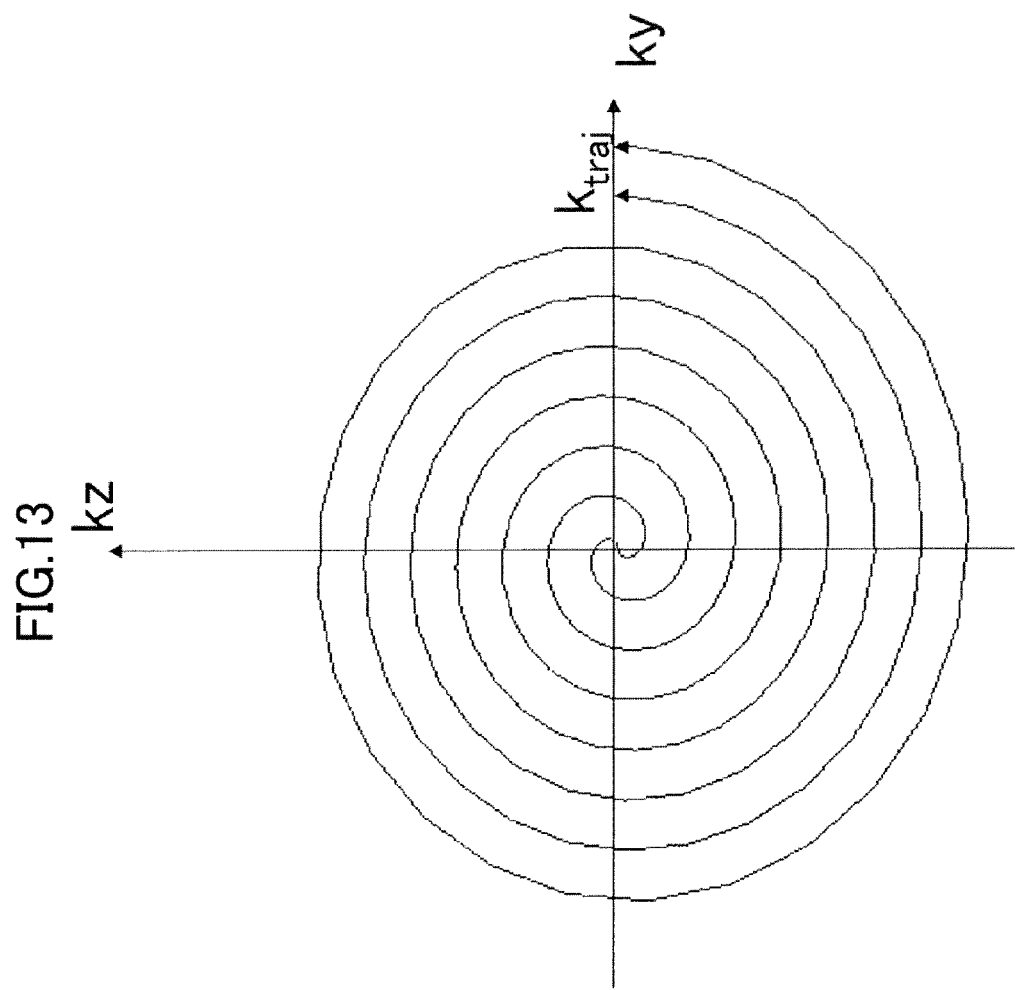
FIG. 13 is an explanatory view for explaining the k space trajectory of a spiral scan.

In addition, although the case where the pulse sequence is FSE and the k space trajectory is a raster scan has been described as an example in the above embodiment, the k space trajectory is not limited thereto. For example, the k space trajectory may be a radial scan shown in FIG. 12 or a spiral scan shown in FIG. 13. In these cases, the above-described $k_{traj}$ axis is kr in FIG. 12 and each spiral line in FIG. 13. In addition, even when the expression using the normal axis is not possible as in NPL 1, $k_{traj}$ can be defined as a trajectory.

In any k space trajectory, the non-oscillatory centric view ordering arrangement is an arrangement in which arrangement groups on the k space, in which the starting point (first echo signal) is arranged, are adjacent to each other and are sequentially arranged in the opposite direction to the starting point of other echo trains for the $k_{traj}$ axis. In addition, an echo signal that determines the contrast is an echo signal arranged in an arrangement group including the origin ($k_{traj}=0$) on the k space trajectory.

In addition, although the case where echo trains corresponding to the number of contrasts to be acquired are collected to fill the k space has been described in the above embodiment, the number of echo trains used for filling is not limited thereto. For example, when the number of contrasts to be acquired is equal to or greater than 3, a smaller number of echo trains than the number of contrasts may be used.

As an example, a case where there are three types of images to be acquired and each k space is filled with two types of echo trains will be described as an example. Two types of echo trains are assumed to be an echo train A and an echo train B, and each echo train number is set to 12. In addition, each echo time TE of three types of different contrasts is set to TE1, TE2, and TE3 (TE1<TE2<TE3). It is assumed that TE1 is a timing at which the first echo signal is acquired, TE2 is a timing at which the sixth echo signal is acquired, and TE3 is a timing at which the eleventh echo signal is acquired. It is assumed that the echo train A is used for the TE1 image and the echo train B is used for the TE2 and TE3 images.

Figure 14:
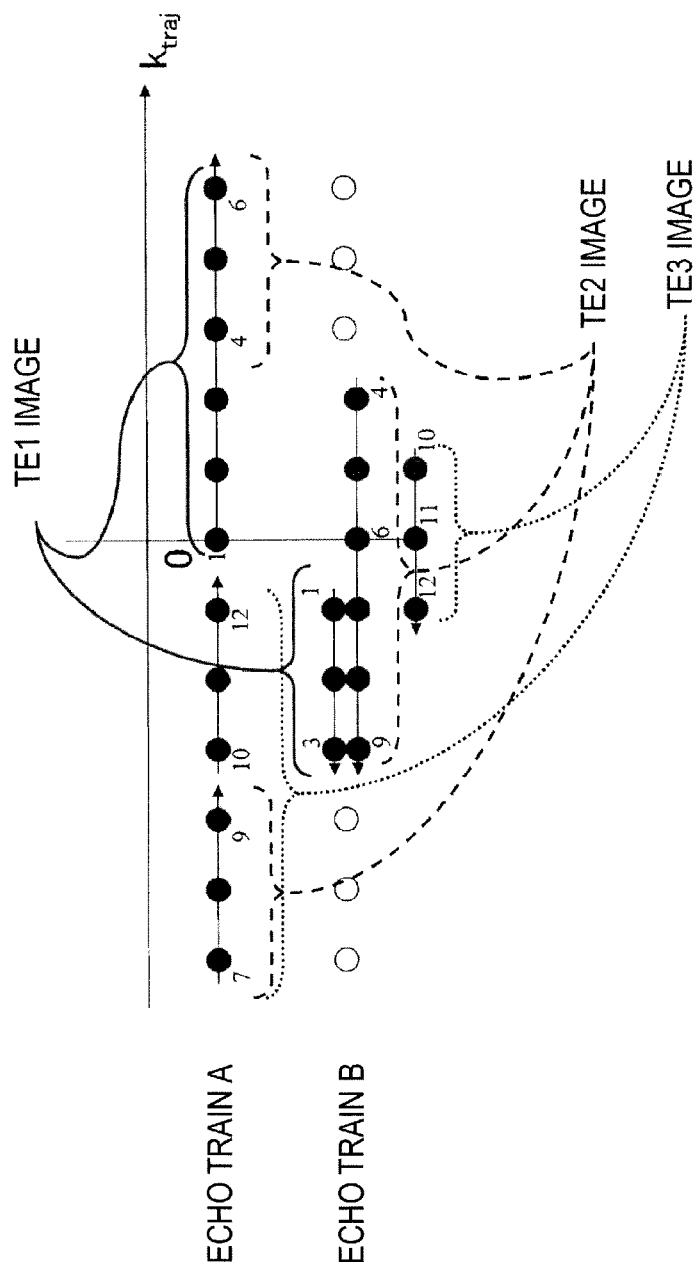
FIG. 14 is an explanatory view for explaining the echo arrangement order of an echo train and an echo signal used in each contrast image when acquiring three types of contrast images with two types of echo trains in the first embodiment.

FIG. 14 is a view for explaining the echo arrangement order and the echo connection point in this case. Also in this case, since TE1<TE2, the echo train A is a reference echo train.

Accordingly, the echo arrangement determination section 321 determines the echo arrangement order of the echo train A first. In addition, the echo arrangement order of the echo train A is the same as described using FIGS. 6 and 8. Here, echo signals up to the echo number 12 are arranged. In addition, the method of determining the echo connection point by the echo connection point determination section 322 is the same as in the embodiment described above.

Then, the echo arrangement determination section 321 determines the echo arrangement order of the echo train B as other echo trains. The echo arrangement order of the echo train B is basically the same as that in the embodiment described above, and is determined so as to be non-oscillatory centric view ordering against the echo train A and such that the echo signal (sixth echo signal) acquired at the timing closest to TE2 is arranged in the arrangement group including the origin ($k_{traj}=0$) on the k space trajectory. Here, the echo arrangement order of the echo train B is determined such that the echo signal (eleventh echo signal) acquired at the timing closest to TE3 is also arranged further in the arrangement group including the origin ($k_{traj}=0$) on the k space trajectory.

Specifically, the echo arrangement determination section 321 arranges echo signals on the k space trajectory sequentially in descending order of echo numbers from the sixth echo signal such that echo numbers on the k space trajectory are sequentially arranged in descending order and the sixth echo signal is arranged in the arrangement group including the origin ($k_{traj}=0$) on the k space trajectory. In this case, each echo signal of the echo train B is arranged until the echo number of the same arrangement group or the adjacent arrangement group on the k space trajectory matches the echo number of the echo signal of the echo train A. In FIG. 14, echo signals up to the fourth echo signal are arranged.

In addition, each echo signal is arranged in ascending order of the echo number sequentially from the sixth echo signal on the k space trajectory until the echo number of the same arrangement group or the adjacent arrangement group matches the echo number of the echo signal of the echo train A. In FIG. 14, echo signals up to the ninth echo signal are arranged.

In addition, echo signals from the twelfth echo signal to the tenth echo signal are arranged such that echo numbers on the k space trajectory are sequentially arranged in descending order and the eleventh echo signal is arranged in the arrangement group including the origin ($k_{traj}=0$) on the k space trajectory.

Here, the echo connection point determination section 322 determines the fourth echo signal as an echo connection point of the echo train B and stores it so as to match the echo train B. In addition, since the ninth echo signal of the echo train B is also continuous with the ninth echo signal of the echo train A, the echo connection point determination section 322 determines it as a connection point and stores it so as to match the echo train B. In addition, since the twelfth echo signal is also continuous with the twelfth echo signal of the echo train A, the echo connection point determination section 322 determines it as a connection point and stores it so as to match the echo train B.

Figure 7:
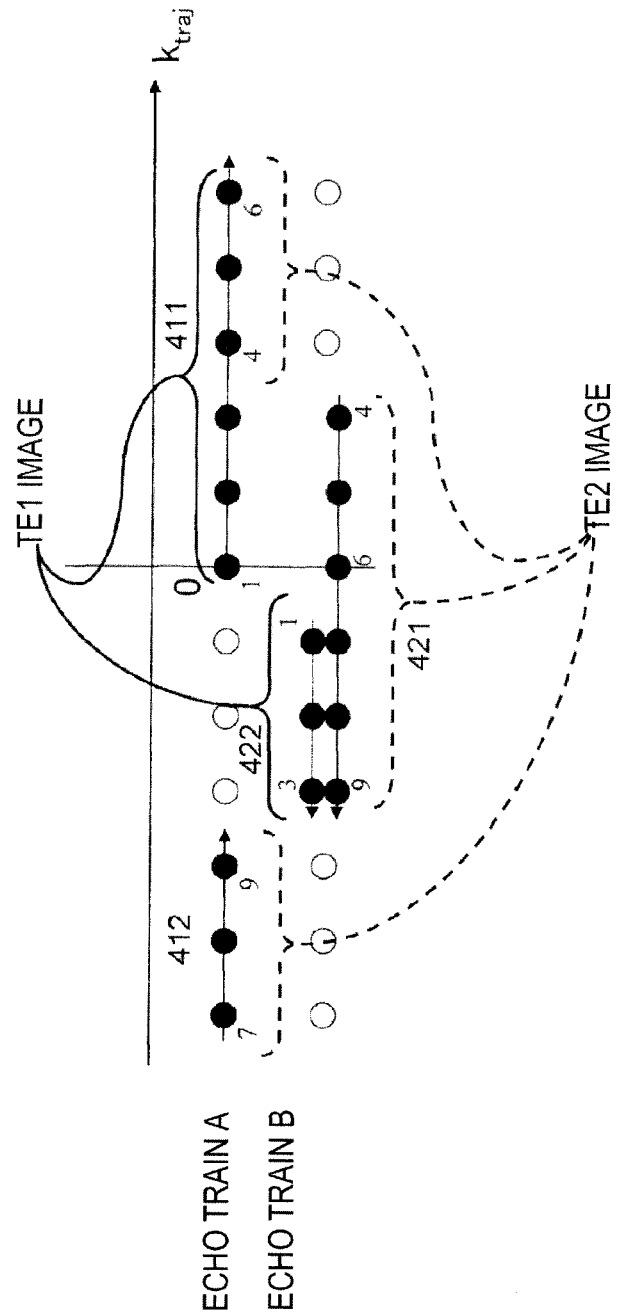
FIG. 7 is an explanatory view for explaining an echo signal used in each contrast image in the first embodiment.

As described above, after determining the echo arrangement, the filling space determination section 323 determines in which image each echo signal is to be used, and determines the k space to be filled. This method will be similarly described using FIG. 14. The TE1 and TE2 images are the same as those when two types of echo trains described in FIG. 7 are used.

For the TE3 image, first, tenth to twelfth echo signal groups of the echo train B are used. This is because the echo signal group of the echo train B is an echo signal group of the echo train for the TE3 image and echo signals acquired at the timing closest to TE3 are a series of echo signal groups arranged in the arrangement group including the origin ($k_{traj}=0$) on the k space trajectory. In addition, since the twelfth echo train is stored as a connection point of the echo train B, a series of echo signal groups starting from the twelfth echo signal of the echo train A continuous to this are also used for the TE3 image.

Also in this example, the fourth to sixth echo signals of the echo train A are shared between the TE1 and TE2 images. In addition, the seventh to ninth echo signals of the echo train A are shared between the TE2 and TE3 images.

Thus, in the case of acquiring three types of images with two types of echo trains, there is a restriction that TE3 should be larger than the second echo connection point as described above. However, a desired number of different contrast images can be acquired using a smaller number of echo trains without degrading the image quality due to discontinuities of the echo arrangement. Therefore, it is possible to acquire a high-quality image at high speed.

Second Embodiment

Next, a second embodiment to which the present invention is applied will be described. In the first embodiment, only echo signals whose echo time continues are used to fill the k space. In the present embodiment, discontinuous echo signals are also used to fill the k space if the predetermined conditions are satisfied.

Figure 15:
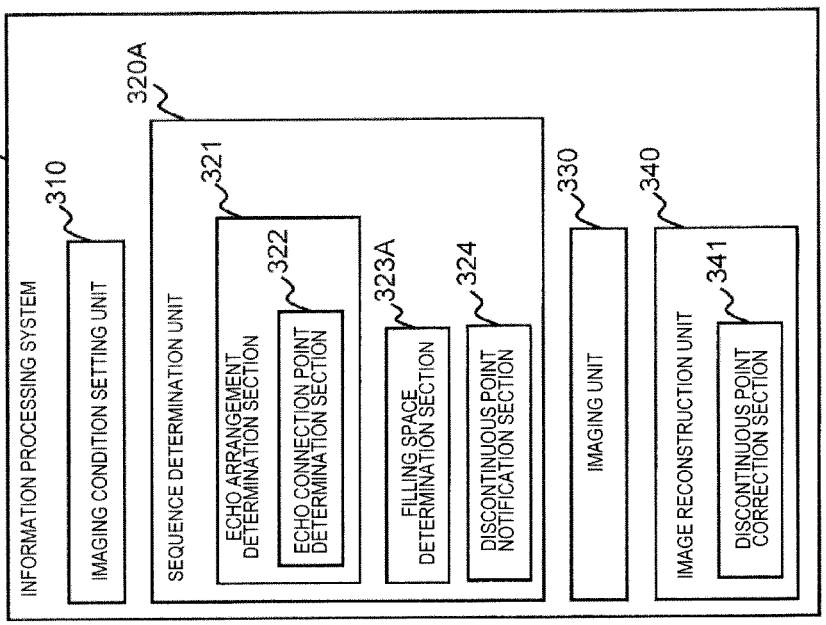
FIG. 15 is a functional block diagram of an information processing system of a second embodiment.

In the present embodiment, when the k space is filled using discontinuous echo signals, the discontinuous portion is corrected. In order to realize this, as shown in FIG. 15, a sequence determination unit 320A of the present embodiment further includes a discontinuous point notification section 324 in addition to the configuration of the sequence determination unit 320 of the first embodiment. In addition, the image reconstruction unit 340 further includes a discontinuous point correction section 341. In addition, the configuration of a filling space determination section 323A that determines the k space filled with each echo signal is also different. Hereinafter, details of each configuration will be described focusing on the differences from the first embodiment.

When the echo arrangement determination section 321 determines the echo arrangement order of each echo train in the same procedure as in the first embodiment, the filling space determination section 323A of the present embodiment determines the k space filled with each echo signal group, which forms each echo train, in the same manner as in the first embodiment.

In the present embodiment, if predetermined conditions are satisfied, echo signals are connected between echo trains and the echo signals are used for filling of the k space even if the signal strength of echo signals is discontinuous on the k space trajectory, that is, even if they are not echo connection points. The conditions in which echo signals are used by connecting them at the echo connection point, at which the echo signal strength is discontinuous, are that continuous echo signals are arranged in a region symmetrical with respect to the origin.

The discontinuous point notification section 324 determines a connection portion other than the echo connection point, that is, a portion where the signal strength of echo signals is discontinuous in the k spatial arrangement determined by the filling space determination section 323A, and notifies the discontinuous point correction section 341 of the image reconstruction unit of it. The determination is performed using the echo number. In addition, the notified echo number may be only a discontinuous point or may be all echo numbers from the discontinuous point to the next connection point or the end.

The discontinuous point correction section 341 corrects echo signals from the discontinuous point, of which notification has been received, to the next connection point or the end and updates the k space with echo signals after correction. Correction is performed after each echo signal is converted by the A/D converter 64. Correction is performed so as to eliminate discontinuities using signal values symmetrical with respect to the origin. For example, correction is performed using the signal strength ratio after performing phase correction. Here, phase correction is performed using a general method, such as subtracting the phase angle of an echo signal in the low spatial frequency region of the echo train B from the phase angle of an echo signal in the low spatial frequency region of the echo train A, for example.

A specific method of correction using the signal strength ratio is as follows.

First, an echo signal (complex number) to be corrected is set to S1, and the signal strength ratio of the echo signal to the reference echo signal is set to R1. An echo signal (complex number) in a region symmetrical to an echo signal, which is to be corrected, with respect to the origin is set to S2, and the signal strength ratio of the echo signal with respect to the reference echo signal is set to R2.

For example, an echo signal, which is adjacent to the discontinuous point and does not need to be corrected, may be set as a reference echo signal for R1, and an echo signal symmetrical with respect to the origin may be set as a reference echo signal for R2. Alternatively, R1 and R2 may be calculated using values after performing function fitting, moving average processing, and the like instead of using the values of these echo signals directly as the reference echo signal.

Using these signal strength ratios, an echo signal (complex number) S1' after correction is calculated by the following expression (1).

$$S1'=S1\times(R2\div R1) \quad (1)$$

The image reconstruction unit 340 reconstructs an image from k space data after updating.

Figure 16:
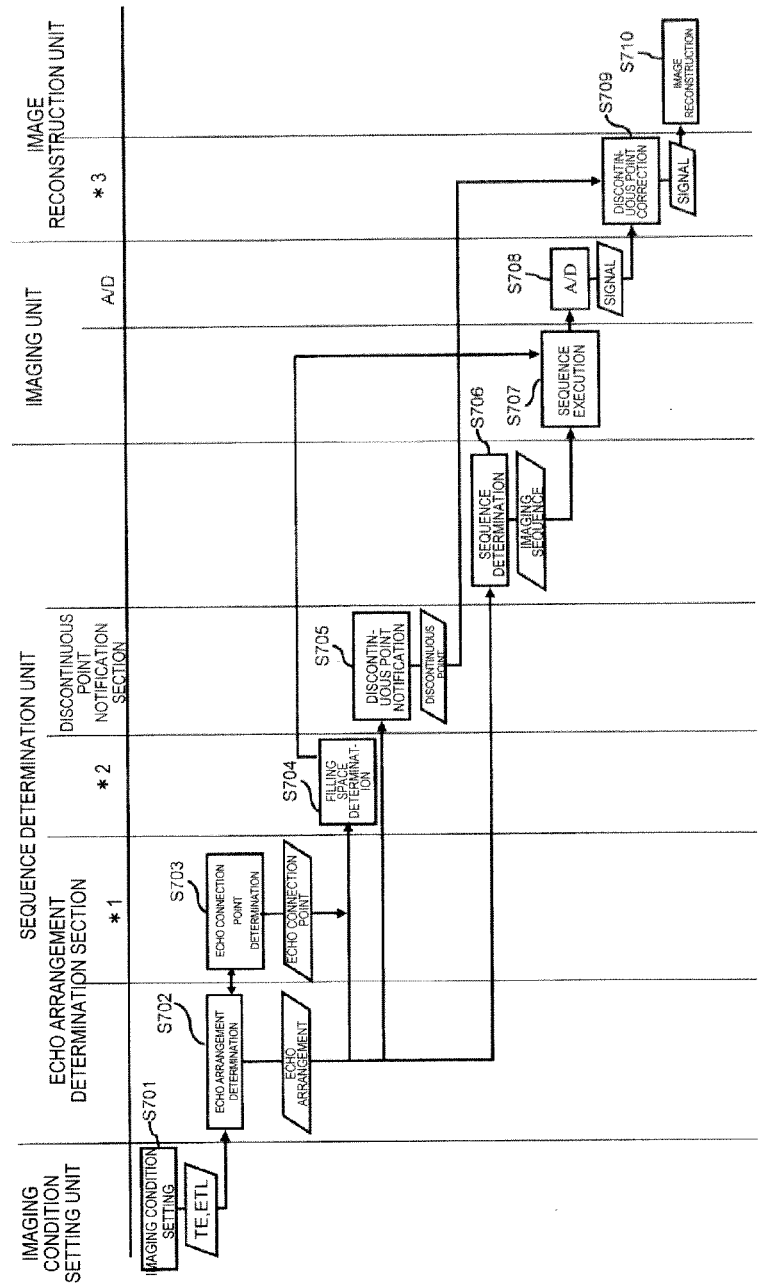
FIG. 16 is an explanatory view for explaining the flow of imaging processing of the second embodiment.

The flow of the imaging processing of the information processing system 7 of the present embodiment will be described. FIG. 16 is a view for explaining the flow of the imaging processing of the present embodiment. Hereinafter, also in the present embodiment, the imaging processing is started when the user inputs imaging conditions or when the user inputs imaging conditions and gives an instruction to start imaging.

The imaging condition setting unit 310 receives the imaging conditions that are input by the user through the input device 75 (step S701). In this case, the imaging conditions include an echo time (TE), which specifies the contrast of an image to be acquired, and the echo train number (ETL) of each echo train to be acquired.

The echo arrangement determination section 321 determines the echo arrangement order of each echo train using the received imaging conditions (step S702).

When determining the echo arrangement order, the echo connection point determination section 322 determines an echo connection point for each of other echo trains and stores the echo connection point so as to match the echo train (step S703).

After the echo arrangement order and the echo connection point are determined, the filling space determination section 323A determines the filling k space of each echo signal on the basis of the determined echo arrangement order and echo connection point (step S704). Then, the discontinuous point notification section 324 determines whether or not there is a connection portion other than the echo connection point in the result determined by the filling space determination section 323A. If there is a connection portion other than the echo connection point, the discontinuous point notification section 324 notifies the discontinuous point correction section 341 of it (step S705). In addition, this processing may be performed at any timing after step S704 as long as it is before correction processing of the described discontinuous point correction section 341, which will be described later.

After the filling k space is determined, the sequence determination unit 320A determines an imaging sequence to realize the determined echo arrangement order (step S706).

Then, the imaging unit 330 executes imaging by making the sequencer 4 operate each unit according to the determined imaging sequence and fills the determined k space with each acquired echo signal, and performs A/D conversion (steps S707 and S708). The discontinuous point correction section 341 corrects the filling result after A/D conversion (step S709), and the image reconstruction unit 340 reconstructs an image from the k space data after correction (step S710).

Figure 17:
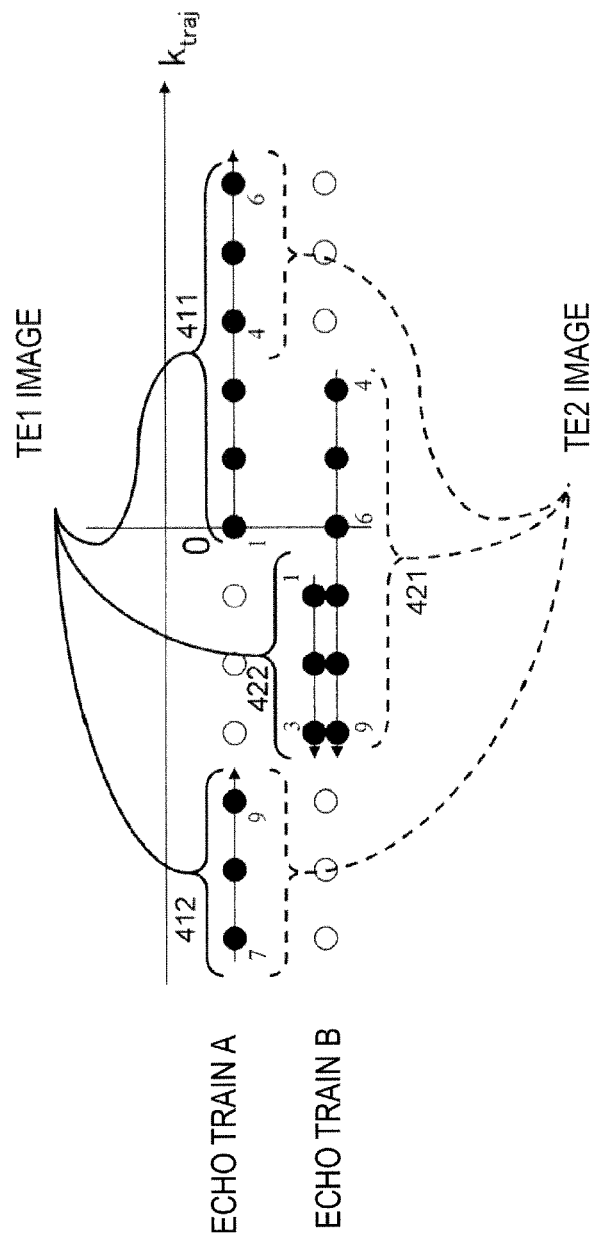
FIG. 17 is an explanatory view for explaining the echo arrangement order of an echo train and an echo signal used in each contrast image in the second embodiment.

The method of determining the echo arrangement order and the correction method of the present embodiment will be specifically described through an example when two types of contrast images described in the first embodiment are reconstructed from two types of echo trains. FIG. 17 is a view for explaining the arrangement order of each echo train and the filling k space of the present embodiment.

The echo arrangement order determination method of the echo arrangement determination section 321 of the present embodiment is the same as that in the first embodiment. However, the filling space determination section 323A of the present embodiment performs determination to fill even the seventh to ninth echo signals (412) of the echo train A, which have not been filled in the k space for the TE1 image since the echo time is discontinuous in the first embodiment, in the k space.

That is, since the fourth to sixth echo signals of the echo train A are present in a region symmetrical with respect to the origin, the filling space determination section 323A of the present embodiment connects the echo trains A and B to each other herein although the third echo signal of the echo train B and the ninth echo signal of the echo train A are not echo connection points.

Figure 18:
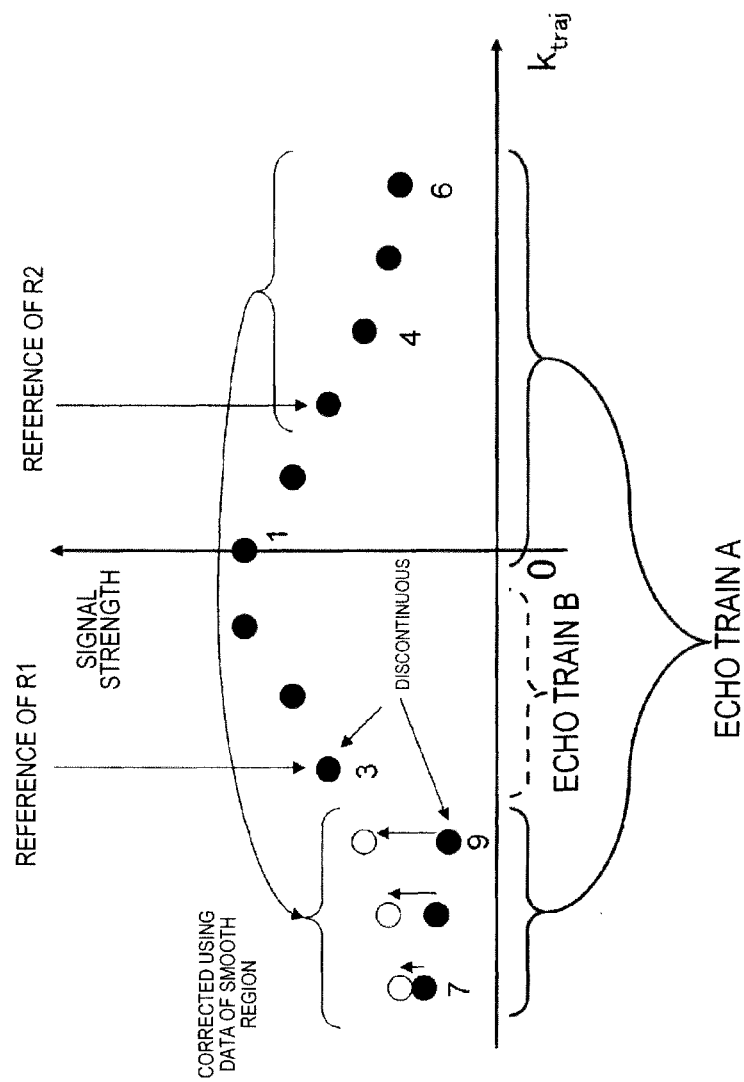
FIG. 18 is an explanatory view for explaining the correction of discontinuous echo signals of the second embodiment.

FIG. 18 shows the k space arrangement of the TE1 image, which is determined as shown in FIG. 17, on the k space trajectory. As shown in this drawing, the ninth echo signal of the echo train A and the third echo signal of the echo train B are adjacent to each other, and this becomes a discontinuous point.

The discontinuous point notification section 324 notifies the discontinuous point correction section 341 of this discontinuous point, and the discontinuous point correction section 341 corrects the signal strength of the seventh to ninth echo signals of the echo train A using echo signals symmetrical with respect to the origin (here, fourth to sixth echo signals of the echo train A) and the above-described expression (1). Echo signals that are symmetrical with respect to the origin and are used for correction are arranged continuously, that is, smoothly.

As described above, according to the present embodiment, it is possible to prevent the degradation of image quality due to discontinuities of the echo arrangement even if an echo is shared between echo trains, in the same manner as in the first embodiment. Therefore, according to the present embodiment, it is possible to reduce the imaging time per one contrast image without degrading the image quality. In addition, it is possible to improve the image quality by reducing the number of echo trains without increasing the imaging time per one contrast.

In addition, according to the present embodiment, when some discontinuous regions are present, the discontinuous regions are corrected using continuous data of the symmetrical region on the k space. Therefore, since the number of echo signals to be used is increased compared with that in the first embodiment, it is possible to obtain an image in a shorter time.

The present invention that has been apparent by the explanation of each of the above embodiments can be summarized as follows. That is, an MRI apparatus of the present invention is an apparatus that reconstructs a plurality of different contrast images from a plurality of echo trains, which are collected by operating each unit according to a pulse sequence defined by imaging parameters, while sharing an echo signal. The apparatus includes: a sequence determination unit configured to determine an echo arrangement order of echo signals, which form the plurality of echo trains, on a trajectory of k space and k space to be filled such that echo time of an echo signal or continuity of a signal strength is maintained in each k space filled with echo signals, which reconstruct each contrast image, and determining the pulse sequence such that echo signals are arranged on a trajectory of each k space in the determined echo arrangement order.

Preferably, the sequence determination unit includes an echo arrangement determination unit configured to determine the echo arrangement order and a filling k space determination unit configured to determine k space of each contrast, which is filled, for each of the echo signals. The echo arrangement determination unit includes echo connection point determination unit for determining an echo signal, from which sharing starts, as a connection point such that echo time of the echo signal continues in each of both k spaces that share the echo signal. For each echo train, echo signals of desired contrast time are arranged in a lowest spatial frequency region on a trajectory of k space for the contrast, and echo trains other than a reference echo train are arranged up to the connection point.

In addition, preferably, for each echo train, the echo arrangement determination unit arranges echo trains other than the reference echo train up to the connection point in non-oscillatory centric view ordering against the reference echo train.

In addition, preferably, echo trains other than the reference echo train after the connection point are sequentially arranged.

In addition, preferably, the echo connection point determination unit determines an echo signal of an echo train other than the reference echo train as the connection point, an echo signal of the reference echo train acquired at the same echo time being arranged at the same position as the echo signal of the echo train other than the reference echo train on a k space trajectory or at a position adjacent to the echo signal of the echo train other than the reference echo train on the k space trajectory.

In addition, preferably, an image reconstruction unit configured to reconstruct each image from echo signals filled in each k space is further provided. The filling k space determination unit notifies the image reconstruction unit of echo signals whose echo time is discontinuous among the filled echo signals, and the image reconstruction unit reconstructs an image after correcting signal strengths of the echo signals that are discontinuously arranged.

In addition, preferably, the number of echo trains of which the echo arrangements are different, which is the number of echo trains to be collected, matches the number of acquired images.

In addition, preferably, the number of echo trains of which the echo arrangements are different, which is the number of echo trains to be collected, is smaller than the number of acquired images.

In addition, a multi-echo multi-contrast imaging method of the present invention is a method of reconstructing a plurality of different contrast images from a plurality of echo trains, which are collected by operating a pulse sequence for measuring an echo train including a plurality of echo signals multiple times, while sharing an echo signal. The method includes: a step of determining an echo arrangement order of echo signals, which form the plurality of echo trains, on a trajectory of k space and k space to be filled such that echo time of an echo signal or continuity of a signal strength is maintained in each k space filled with echo signals, which reconstruct each contrast image; and a sequence determination step of determining the pulse sequence such that echo signals are arranged on a trajectory of each k space in the determined echo arrangement order.

In addition, preferably, the sequence determination step includes an echo arrangement determination step of determining the echo arrangement order and a filling k space determination step of determining k space of each contrast, which is filled, for each of the echo signals. The echo arrangement determination step includes an echo connection point determination step of determining an echo signal, from which sharing starts, as a connection point such that echo time of the echo signal continues in each of both k spaces that share the echo signal. For each echo train, echo signals of desired contrast time are arranged in a lowest spatial frequency region on a trajectory of k space for the contrast, and echo trains other than a reference echo train are arranged up to the connection point.

REFERENCE SIGNS LIST

1: object
2: static magnetic field generation system
3: gradient magnetic field generation system
4: sequencer
5: signal transmission system
6: signal receiving system
7: information processing system
10: MRI apparatus
31: gradient magnetic field coil
32: gradient magnetic field power source
51: high-frequency coil (transmission coil)
52: synthesizer
53: modulator
54: high frequency amplifier
61: high-frequency coil (receiving coil)
62: amplifier
63: quadrature phase detector
64: A/D converter
71: CPU
72: storage device
73: external storage device
74: display device
75: input device
200: FSE sequence
201: excitation RF pulse
202: slice selection gradient magnetic field pulse
203: slice re-phase pulse
204: frequency dephase gradient magnetic field pulse
205: reverse RF pulse
206: slice selection gradient magnetic field pulse
207: phase encoding gradient magnetic field pulse
208: frequency encoding gradient magnetic field pulse
209: sampling window
210: echo train
310: imaging condition setting unit
320: sequence determination unit
320A: sequence determination unit
321: echo arrangement determination section
322: echo connection point determination section
323: filling space determination section
323A: filling space determination section
324: discontinuous point notification section
330: imaging unit
340: image reconstruction unit
341: discontinuous point correction section
411: echo signal group
412: echo signal group
421: echo signal group
422: echo signal group

The invention claimed is:

1. A magnetic resonance imaging apparatus that reconstructs a plurality of different contrast images from a plurality of echo trains, which are collected by operating each unit according to a pulse sequence defined by imaging parameters, while sharing an echo signal, comprising:
a sequence determination unit configured to determine an echo arrangement order of echo signals, which form the plurality of echo trains, on a trajectory of k space and k space to be filled such that echo time of an echo signal or continuity of a signal strength is maintained in each k space filled with echo signals, which are used for reconstructing each contrast image, and determining the pulse sequence such that echo signals are arranged on a trajectory of each k space in the determined echo arrangement order,
wherein the sequence determination unit includes an echo arrangement determination unit configured to determine the echo arrangement order and a filling k space determination unit configured to determine k space of each contrast, which is filled, for each of the echo signals,
the echo arrangement determination unit includes an echo connection point determination unit configured to determine an echo signal, from which sharing starts, as a connection point such that echo time of the echo signal continues in each of both k spaces that share the echo signal, and
for each echo train, echo signals of desired contrast time are arranged in a lowest spatial frequency region on a trajectory of k space for the contrast, and echo trains other than a reference echo train that fills a low spatial frequency region of k space for a contrast image with the shortest echo time are arranged up to the connection point.

2. The magnetic resonance imaging apparatus according to claim 1,
wherein, for each echo train, the echo arrangement determination unit arranges echo trains other than the reference echo train up to the connection point in non-oscillatory centric view ordering against the reference echo train.

3. The magnetic resonance imaging apparatus according to claim 1,
wherein echo trains other than the reference echo train after the connection point are sequentially arranged.

4. The magnetic resonance imaging apparatus according to claim 1,
wherein the echo connection point determination unit determines an echo signal of an echo train other than the reference echo train as the connection point, an echo signal of the reference echo train acquired at the same echo time being arranged at the same position as the echo signal of the echo train other than the reference echo train on a k space trajectory or at a position adjacent to the echo signal of the echo train other than the reference echo train on the k space trajectory.

5. The magnetic resonance imaging apparatus according to claim 1, further comprising:

an image reconstruction unit configured to reconstruct each image from echo signals filled in each k space, wherein the filling k space determination unit notifies the image reconstruction unit of echo signals whose echo time is discontinuous among the filled echo signals, and the image reconstruction unit reconstructs an image after correcting signal strengths of the echo signals that are discontinuously arranged.

6. The magnetic resonance imaging apparatus according to claim 1, wherein the number of echo trains of which the echo arrangements are different, which is the number of echo trains to be collected, matches the number of acquired images.

7. The magnetic resonance imaging apparatus according to claim 1, wherein the number of echo trains of which the echo arrangements are different, which is the number of echo trains to be collected, is smaller than the number of acquired images.

8. A multi-echo multi-contrast imaging method of reconstructing a plurality of different contrast images from a plurality of echo trains, which are collected by operating a pulse sequence for measuring an echo train including a plurality of echo signals multiple times, while sharing an echo signal, the method comprising:

a step of determining an echo arrangement order of echo signals, which form the plurality of echo trains, on a trajectory of k space and k space to be filled such that echo time of an echo signal or continuity of a signal strength is maintained in each k space filled with echo signals, which are used for reconstructing each contrast image; and a sequence determination step of determining the pulse sequence such that echo signals are arranged on a trajectory of each k space in the determined echo arrangement order, wherein the sequence determination step includes an echo arrangement determination step of determining the echo arrangement order and a filling k space determination step of determining k space of each contrast, which is filled, for each of the echo signals, the echo arrangement determination step includes an echo connection point determination step of determining an echo signal, from which sharing starts, as a connection point such that echo time of the echo signal continues in each of both k spaces that share the echo signal, and for each echo train, echo signals of desired contrast time are arranged in a lowest spatial frequency region on a trajectory of k space for the contrast, and echo trains other than a reference echo train that fills a low spatial frequency region of k space for a contrast image with the shortest echo time are arranged up to the connection point.

\* \* \* \* \*